United States Patent
Wieland

(10) Patent No.: US 8,859,983 B2
(45) Date of Patent: Oct. 14, 2014

(54) METHOD OF AND SYSTEM FOR EXPOSING A TARGET

(71) Applicant: Mapper Lithography IP B.V., Delft (NL)

(72) Inventor: Marco Jan-Jaco Wieland, Delft (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 13/935,602

(22) Filed: Jul. 5, 2013

(65) Prior Publication Data

US 2014/0042334 A1    Feb. 13, 2014

Related U.S. Application Data

(63) Continuation of application No. 12/960,675, filed on Dec. 6, 2010, now Pat. No. 8,502,174, which is a continuation of application No. PCT/EP2009/056863, filed on Jun. 4, 2009.

(60) Provisional application No. 61/058,596, filed on Jun. 4, 2008, provisional application No. 61/179,761, filed on May 20, 2009.

(51) Int. Cl.
*H01J 37/317*    (2006.01)
*B82Y 10/00*    (2011.01)
*B82Y 40/00*    (2011.01)

(52) U.S. Cl.
CPC ............. *H01J 37/3177* (2013.01); *B82Y 10/00* (2013.01); *B82Y 40/00* (2013.01)
USPC .................. 250/396 R; 250/398; 250/492.22

(58) Field of Classification Search
CPC .................................................... H01J 37/3177
USPC ....................................................... 250/396 R
See application file for complete search history.

(56) References Cited

U.S. PATENT DOCUMENTS

| 5,864,142 | A | 1/1999 | Muraki et al. |
| 5,920,077 | A | 7/1999 | Oae et al. |
| 6,124,599 | A | 9/2000 | Muraki |
| 6,133,986 | A | 10/2000 | Johnson |
| 6,337,485 | B1 | 1/2002 | Muraki |

(Continued)

FOREIGN PATENT DOCUMENTS

| EP | 0508151 A1 | 10/1992 |
| GB | 2413393 A | 10/2005 |

(Continued)

*Primary Examiner* — Phillip A Johnston
(74) *Attorney, Agent, or Firm* — Hoyng Monegier LLP; David P. Owen; Minerva Rivero

(57) ABSTRACT

The invention relates to a method of exposing a target by means of a plurality of beamlets. First, a plurality of beamlets is provided. The beamlets are arranged in an array. Furthermore, a target to be exposed is provided. Subsequently, relative movement in a first direction between the plurality of beamlets and the target is created. Finally, the plurality of beamlets is moved in a second direction, such that each beamlet exposes a plurality of scan lines on the target. The relative movement in the first direction and the movement of the plurality of beamlets in the second direction are such that the distance between adjacent scan lines exposed by the plurality of beamlets is smaller than a projection pitch $P_{proj,X}$ in the first direction between beamlets of the plurality of beamlets in the array.

20 Claims, 18 Drawing Sheets

(56) References Cited

U.S. PATENT DOCUMENTS

| | | |
|---|---|---|
| 6,657,210 B1 | 12/2003 | Muraki |
| 6,768,125 B2 * | 7/2004 | Platzgummer et al. .. 250/492.22 |
| 6,897,458 B2 | 5/2005 | Wieland et al. |
| 7,106,417 B1 | 9/2006 | Amm |
| 7,276,714 B2 * | 10/2007 | Platzgummer et al. .. 250/492.22 |
| 2003/0108806 A1 | 6/2003 | Chen |
| 2003/0122091 A1 | 7/2003 | Almogy |
| 2004/0143356 A1 | 7/2004 | Yoda et al. |
| 2005/0062950 A1 | 3/2005 | van 't Spijker et al. |
| 2005/0084766 A1 | 4/2005 | Sandstrom |
| 2005/0269528 A1 | 12/2005 | Kruit |
| 2006/0281032 A1 | 12/2006 | Van Groos |
| 2009/0201482 A1 | 8/2009 | Ozaki et al. |
| 2010/0245440 A1 | 9/2010 | Usuda et al. |

FOREIGN PATENT DOCUMENTS

| | | |
|---|---|---|
| JP | 2007 216641 A2 | 8/2007 |
| WO | WO 9838597 A2 | 9/1998 |
| WO | WO 0212961 A1 | 2/2002 |

* cited by examiner

| N | α | $P_{proj}$ | $P_{proj}/L_{pixX}$ | K | $L_{pix\_X}$ (nm) | $W_{proj}$ (nm) |
|---|---|---|---|---|---|---|
| 4 | 0.464 | 26.9 | 8 | 9 | 2.99 | 82 |
| 9 | 0.322 | 19.0 | 6 | 7 | 2.71 | 154 |
| 16 | 0.245 | 14.6 | 5 | 5 | 2.92 | 222 |
| 25 | 0.197 | 11.8 | 4 | 4 | 2.95 | 287 |
| 36 | 0.165 | 9.89 | 3 | 5 | 1.98 | 350 |
| 49 | 0.142 | 8.51 | 3 | 3 | 2.84 | 413 |
| 64 | 0.124 | 7.46 | 3 | 3 | 2.49 | 476 |
| 81 | 0.111 | 6.64 | 2 | 2 | 3.32 | 538 |
| 100 | 0.100 | 5.99 | 2 | 3 | 2.00 | 600 |

FIG. 16

METHOD OF AND SYSTEM FOR EXPOSING A TARGET

This application is a continuation of U.S. application Ser. No. 12/960,675 filed on Dec. 6, 2010, which is a continuation of international application no. PCT/NL2009/056863 filed on Jun. 4, 2009, which claims priority from U.S. Provisional application No. 61/058,596 filed on Jun. 4, 2008 and U.S. Provisional application No. 61/179,761 filed on May 20, 2009.

BACKGROUND OF THE INVENTION

1. Field of the Invention

The present invention relates to a method of exposing a target by means of a plurality of beamlets, in particular by means of a charged particle multi-beamlet system, and to a computer readable medium for performing the methods when executed by a processor.

2. Description of the Related Art

Systems using a black and white writing strategy, i.e. an "on" and "off" writing strategy, are widely known in the art. They may use, for example, laser beams or charge particle beams, and may feature the use of direct writing means in maskless systems. By modulating the beam (or beams in multi-beam systems), individual grid cells in a rasterized virtual grid may be exposed or not exposed to write the desired pattern on to the target. Such beams are characterized by a so-called beam effect in the target surface, which is often described by a point spread function. The point spread function generally has a Gaussian distribution. The beam size is generally defined as the size of the distribution in which 50% of the beam energy is present.

A particular kind of charged particle beam based lithographic system is known from U.S. Pat. No. 6,897,458 assigned to the owner of the present invention, and involves a massive plurality of charged particle beamlets generated in a charged particle beam column for exposing a target. The charged particle beamlets are scanned over the target while being modulated. Additionally, the target may be capable of moving relative to the beams, for example in a direction transverse to the scanning direction of the beams. The modulation of the beamlets is performed on the basis of pattern data provided to the lithographic system. In the particular system described, the modulation is performed by blanking or blocking beamlets to effectively switch the beamlets on and off.

Exposing a target using this type of lithography system is achieved by the combination of relative movement of the target and modulation (e.g. timed "on" and "off" switching or blanking) of each charged particle beamlet by the blanker optics. A known method to expose a substrate with beamlets is a raster scan method. In order to accurately expose the target with an exposure pattern, the pattern data is rasterized. The target is positioned on a motor driven stage that is moved in a continuous motion. As the stage is moved, the beam is scanned in a direction substantially perpendicular to the stage motion. By supplying the rasterized pattern data to the system, timed so that the beamlets are modulated in synchronism with the beamlet deflection and stage motion, the pattern represented by the pattern data can be transposed as an exposure pattern onto the surface of the target. The rasterized pattern data corresponds to an exposure pattern on a virtual raster cell grid on the surface of the target.

Existing charged particle beam technology is suitable for lithography systems for relatively course patterning of images, for example to achieve critical dimensions of 90 nm and higher. However, a growing need exists for improved performance. It is desired to achieve considerably smaller critical dimensions, for example 22 nm, while maintaining sufficient wafer throughput, e.g. between 10 and 60 wafers per hour.

The total current of the beamlets required to achieve a particular throughput, e.g. in lithography defined as a particular number of wafers exposed per hour, depends on the required dose, the area of the wafer, and the overhead time, i.e. the time to move a new wafer into position for exposure. Among others, the required dose in these shot noise limited systems depends on the required feature size and uniformity, and beam energy.

For electron beam systems, the maximum single beam current is determined by the spot size. To obtain a good CD uniformity, the required spot size will limit the single beam current to much less than the current required to obtain a high throughput. Thus a large number of beamlets is required (typically more than 10,000 for a throughput of 10 wafers per hour). As the total current through one lens is limited by Coulomb interactions between electrons, the number of lenses in a high throughput system also needs to be large.

Increasing the current in the system, results in an increase of the total current on the target. At the same time, however, in order to maintain performance, the number of electrons impinging on the target surface per square critical dimension should be maintained constant.

However, designing a system to generate beamlets having a smaller spot size, considerably reduces the charged particle current that may be applied to the target by each beamlet. Irrespective of the brightness of the charged particle source used, the preceding requirements imply a considerably more than linear increase in the number of beamlets in a charged particle multi-beam system compared to the reduction in critical dimension at the same wafer throughput.

In order to obtain a high throughput using such a multi-beam system, a beamlet writing strategy is required to expose the desired pattern as efficiently as possible. The relative size of the beamlets and the lenses that focus the beamlets compared to the desired size of the virtual grid limits the possible arrangements of beamlets, so that the beamlets are separated by a sufficiently greater distance than the diameter of the lenses.

It is desired that the writing strategy does not require overly complex movement of the beamlets and the target. In this regard, a system providing for uniform deflection of all the beamlets rather than individual control of each beamlet's deflection is desired, particularly for a system having a very large number of beamlets. As a consequence, a simple raster scan of the beamlets as a group may be undesirable due to the incomplete exposure of the areas at the end of each scan of the group of beamlets. The larger the number of beamlets, the greater the effect of these areas of incomplete exposure will have on efficient utilization of the system. It is also desired that the writing strategy reduces the effects of unintended variations between the individual beamlets in a multi-beamlet system.

It is therefore desirable to use a method of exposing a target by means of a plurality of beamlets with an improved performance.

BRIEF SUMMARY OF THE INVENTION

Embodiments of the invention relate to a method of exposing a target by means of a plurality of beamlets. Additionally, embodiments of the invention relate to a charged particle multi-beamlet system for exposing a target using a plurality of beamlets.

In an embodiment, the invention provides a method of exposing a target by means of a plurality of beamlets, the method comprising:

provide a plurality of beamlets, the beamlets being arranged in an array;
providing a target to be exposed;
creating relative movement in a first direction between the plurality of beamlets and the target;
moving the plurality of beamlets in a second direction such that each beamlet exposes a plurality of parallel scan lines on the target;

wherein the relative movement in the first direction and the movement of the plurality of beamlets in the second direction are such that the distance between adjacent parallel scan lines exposed by the plurality of beamlets is smaller than a projection pitch in the first direction between beamlets of the plurality of beamlets in the array.

In an embodiment, the invention provides a charged particle multi-beamlet system for exposing a target using a plurality of beamlets, the system comprising:

a beamlet pattern generator for providing an exposure pattern formed by a plurality of beamlets, the plurality of beamlets being arranged in groups of beamlets;
an array of projection lens systems for projecting the groups of beamlets on to the surface of the target, each projection lens system corresponding with a group of beamlets;
a deflector array for deflecting a group of beamlets in a second direction, the deflector array comprising a plurality of deflectors, each deflector arranged to deflect a corresponding group of beamlets;
a substrate support member for supporting the target to be exposed;
a control unit arranged to coordinate relative movement between the substrate support member and the plurality of beamlets in a first direction and movement of the group of beamlets in the second direction such that the distance between adjacent scan lines exposed by the plurality of beamlets is smaller than a projection pitch in the first direction between beamlets of the plurality of beamlets in the array.

Exposing a target using aforementioned method or system enables full coverage of an area to be exposed by a plurality of beamlets. Additionally, the transmission of charged particles through the system is relatively high.

The distance between adjacent scan lines exposed by the plurality of beamlets may equal the projection pitch divided by a positive integer larger than one. The positive integer may equal a factor of the number of beamlets minus one. In this embodiment, full coverage of the area to be exposed is achieved in a very efficient way.

In an embodiment, the invention provides a method of exposing a target by means of a plurality of beamlets, the method comprising:

providing a plurality of beamlets, the beamlets being arranged in an array;
providing a target to be exposed;
creating relative movement in a first direction between the plurality of beamlets and the target;
moving the plurality of beamlets in a second direction in a plurality of scans such that each beamlet exposes a plurality of parallel scan lines on the target;

wherein the relative movement in the first direction and the movement of the plurality of beamlets in the second direction are such that the distance between subsequent scan lines exposed by the same beamlet within the array of beamlets is smaller than the projected size of the array in the first direction, so that scan lines of one or more beamlets from a second scan are interleaved with scan lines of one or more beamlets from a first scan.

In an embodiment, the invention provides a charged particle multi-beamlet system for exposing a target using a plurality of beamlets, the system comprising:

a beamlet pattern generator for providing an exposure pattern formed by a plurality of beamlets, the plurality of beamlets being arranged in groups of beamlets;
an array of projection lens systems for projecting the groups of beamlets on to the surface of the target, each projection lens system corresponding with a group of beamlets;
a deflector array for deflecting a group of beamlets in a second direction, the deflector array comprising a plurality of deflectors, each deflector arranged to deflect a corresponding group of beamlets;
a substrate support member for supporting the target to be exposed;
a control unit arranged to coordinate relative movement between the substrate support member and the plurality of beamlets in a first direction and movement of the group of beamlets in the second direction such that the distance between adjacent scan lines exposed by the plurality of beamlets is smaller than a projection pitch $P_{proj,X}$ in the first direction between beamlets of the plurality of beamlets in the array.

Coordination of relative movement in the first direction and movement in the second direction by using aforementioned method or system enables full coverage of the area to be exposed by the plurality of beamlets. Additionally, the transmission of charged particles through the system is relatively high. Finally, stepwise movement in the first direction may be avoided.

The distance between subsequent scan lines exposed by the same beamlet within the array of beamlets may equal $$\frac{N}{F_{N-1}} P_{proj,X},$$

where $P_{proj,X}$ is a projection pitch in the first direction between beamlets of the array, and $F_{N-1}$ is a factor of (N−1) unequal to one, and N is the number of beamlets in the array. Obtaining aforementioned distance between subsequent scan lines enables full coverage of the area to be exposed in a very efficient manner without while stepwise movement in the first direction is minimized.

Aforementioned relative movement in the first direction may have a constant velocity. Furthermore, the movement in the second direction may be a repetitive movement. The repetitive movement may have a constant frequency.

In aforementioned methods according to embodiments of the invention, the method may further comprise defining a virtual grid over the target, the grid providing positions of exposing or not exposing the target by respective beamlets, the exposure or non-exposure in dependence of a blanking or a non blanking of each individual beamlet. The virtual grid may comprise comprises a first axis being oriented in line with the first direction of movement, and a second axis being oriented transverse thereto. In embodiments of the invention, the plurality of beamlets are divided in groups, each group of beamlets being arranged in an array, such that the beamlets of the group do not overlap. As a result, the array of beamlets corresponds to an array of locations in the grid.

In aforementioned methods and systems, the projection pitch in the first direction between beamlets of the array may be equal to or smaller than a beamlet spot size as projected on the target. Alternatively, the beamlet spot size as projected on the target may be larger than the distance between adjacent scan lines exposed by the array of beamlets. A small size of the projection pitch in the first direction with respect to the beamlet spot size may enhance averaging out of variation between different beamlets.

In embodiments of aforementioned methods and systems, the array of beamlets may comprise a number of rows and a number of columns, at least one of the rows and columns being positioned at an angle unequal to 90° with respect to the first direction and the second direction. The number of rows may be equal to the number of columns.

Finally, in an embodiment, the invention provides a computer readable medium for performing, when executed by a processor, an embodiment of aforementioned methods of exposing a target by means of a plurality of beamlets in a charged particle multi-beamlet system.

BRIEF DESCRIPTION OF THE DRAWINGS

Various aspects of the invention will be further explained with reference to embodiments shown in the drawings wherein:

FIG. 16 is a table showing examples of values for pixel size and grid width for various arrangements;

DESCRIPTION OF ILLUSTRATIVE EMBODIMENTS

The following is a description of various embodiments of the invention, given by way of example only and with reference to the drawings.

Figure 1:
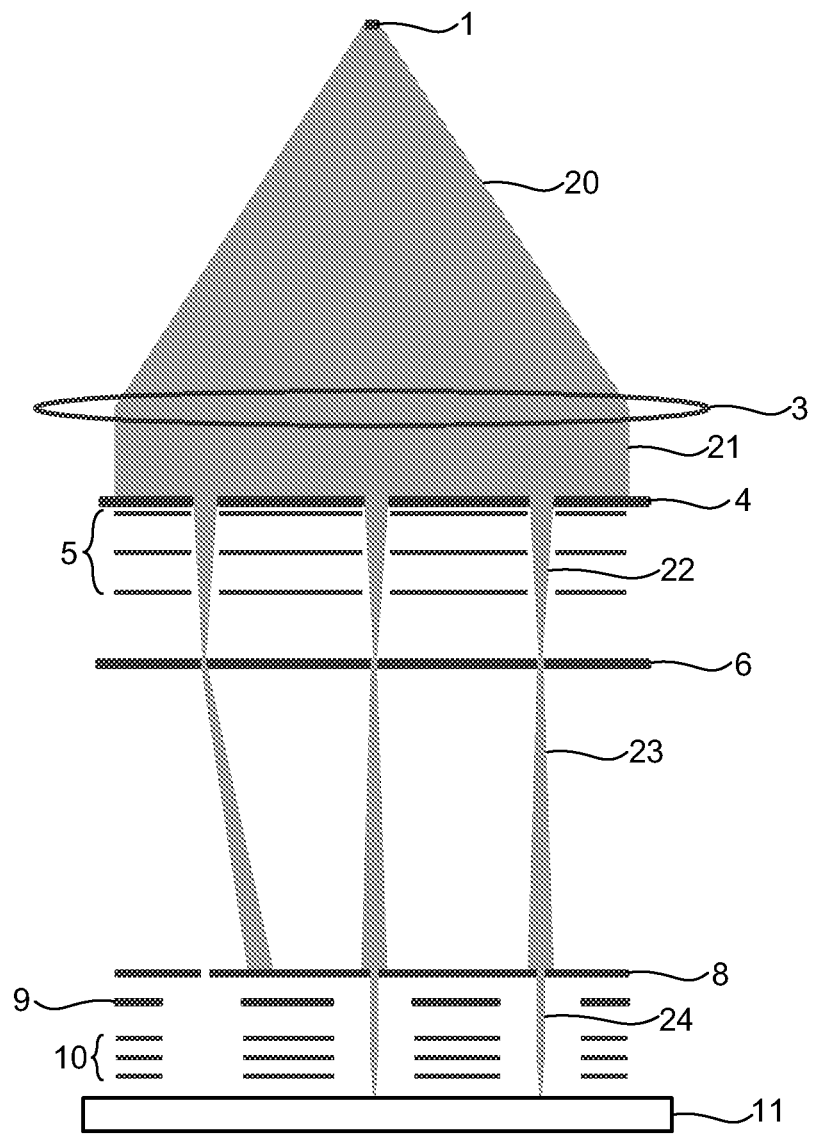
FIG. 1 is a simplified schematic overview of an example of a charged particle multi beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897,458 and 6,958,804 and 7,019,908 and 7,084,414 and 7,129,502, U.S. patent application publication nos. 2007/0064213 and 2008/073588, and co-pending U.S. patent application Ser. Nos. 61/031,573 and 61/045,243 and 61/055,839, which are all assigned to the owner of the present invention and are all hereby incorporated by reference in their entirety. In the embodiment shown in FIG. 1, the lithography system comprises an electron source 1 for producing a homogeneous, expanding electron beam 20. Beam energy is preferably maintained relatively low in the range of about 1 to 10 keV.

The electron beam 20 from the electron source 1 passes a collimator lens 3 to produce a collimated electron beam 21, which impinges on an aperture array 4, which blocks part of the beam and allows a plurality of beamlets 22 to pass through the aperture array 4. The system generates a large number of beamlets 22, e.g. about 10,000 to 1,000,000 beamlets.

The plurality of electron beamlets 22 pass through a condenser lens array 5 which focuses each of the electron beamlets 22 in the plane of a beamlet blanker array 6. This beamlet blanker array 6 comprises a plurality of blankers which are each capable of deflecting one or more of the electron beamlets 22.

Subsequently, the electron beamlets 22 enter the end module 7. The end module 7 is preferably constructed as an insertable, replaceable unit which comprises various components. In this embodiment, the end module comprises a beam stop array 8, a beam deflector array 9, and a projection lens arrangement 10. The end module 7 will, amongst other functions, provide a demagnification of about 25 to 500 times. Additionally, the end module may be arranged to deflect the beamlets 22. After leaving the end module 7, the beamlets 22 impinge on a surface of a target 11 positioned at a target plane. For lithography applications, the target usually comprises a wafer provided with a charged-particle sensitive layer or resist layer.

In the end module 7, the electron beamlets 22 first pass beam stop array 8. This beam stop array 8 largely determines the opening angle of the beamlets. In an embodiment, the apertures in beam stop array 8 are round, resulting in beamlets with a generally uniform opening angle.

The passages of the beam stop array 8 may be aligned with the elements of the beamlet blanker array 6. The beamlet blanker array 6 and beam stop array 8 then operate together to block or let pass the beamlets 22 in the following way. If beamlet blanker array 6 deflects a beamlet, it will not pass through the corresponding aperture in beam stop array 8. Instead, it will be blocked by the substrate of beam stop array 8. However, if beamlet blanker array 6 does not deflect a beamlet, it will pass through the corresponding aperture in beam stop array 8, and will then be projected as a spot on the surface of target 11. In this way the individual beamlets 22 may be effectively switched on and off.

Next, the beamlets 22 pass through a beam deflector array 9 which provides for deflection of each beamlet 22 in a direction substantially perpendicular to the direction of the undeflected beamlets 22. Next, the beamlets 22 pass through projection lens arrangement 10 and are projected onto a target 11 to be exposed, typically a wafer, located in a target plane.

Figure 2:
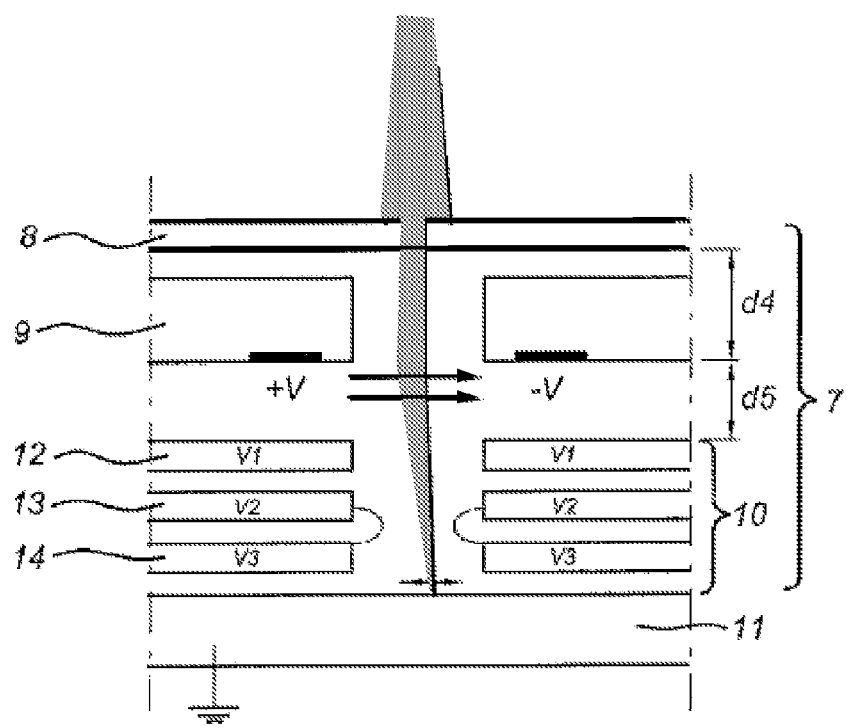
FIG. 2 is a simplified schematic overview, in side view, of an end module of the lithography system of FIG. 1.

FIG. 2 shows an embodiment of end module 7 in more detail, showing the beam stop array 8, the deflection array 9, and the projection lens arrangement 10, projecting an electron beamlet onto a target 11. The beamlets 22 are projected onto target 11, preferably resulting in a geometric spot size of about 10 to 30 nanometers in diameter. The projection lens arrangement 10 in such a design may provide a demagnification of about 100 to 500 times. In the embodiment of FIG. 2, a central part of a beamlet 22 first passes through beam stop array 8 (assuming it has not been deflected by beamlet blanker array 6). Then, the beamlet passes through a deflector or set of deflectors arranged in a sequence forming a deflection system, of beam deflector array 9. The beamlet 22 subsequently passes through an electro-optical system of projection lens arrangement 10 and finally impinges on a target 11 in the target plane.

The projection lens arrangement 10 in the embodiment of the end module shown in FIG. 2, has three plates 12, 13 and 14 arranged in sequence, used to form an array of electrostatic lenses. The plates 12, 13, and 14 preferably comprise plates or substrates with apertures formed in them. The apertures are preferably formed as round holes though the plate, although other shapes can also be used. In an embodiment, the plates are formed of silicon or other semiconductor processed using process steps well-known in the semiconductor chip industry. The apertures can be conveniently formed in the plates using lithography and etching techniques known in the art.

The plates may be coated with an electrically conductive coating to form electrodes. A metal with a conductive native oxide may be used for the electrode, such as molybdenum, deposited onto the plate using techniques well known in the art. An electrical voltage is applied to each electrode to control the shape of the electrostatic lenses formed at the location of each aperture. Each electrode is controlled by a single control voltage for the complete array. Thus, in the embodiment shown in FIG. 2 with three electrodes, there will be only three voltages for all lenses.

The three control voltages V1, V2, and V3 create an array of uniform electrostatic lenses which focus and demagnify the large number of electron beamlets 22. The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates. The number of plates used in different projection lens arrangements may vary, and the number of common control signals may also vary.

The voltages V1, V2, and V3 may be set so that the difference in voltage between the second and third plates (13 and 14) is greater than the difference in voltage between first and second plates (12 and 13). This results in stronger lenses being formed between plates 13 and 14 so that the effective lens plane of each projection lens system is located between plates 13 and 14, as indicated in FIG. 2 by the curved hatched lines between plates 13 and 14 in the lens opening. This places the effective lens plane closer to the target and enables the projection lens systems to have a shorter focal length. It is further noted that while, for simplicity, the beamlet in FIG. 2 is shown focused as from the deflector 9, a more accurate representation of the focusing of beamlet 21, e.g. as in a traced ray illustration, would indicate that the actual lens plane of lens system 10 is between plates 13 and 14.

FIG. 2 also illustrates deflection of a beamlet 21 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion. Similarly, deflection may also be performed in a different direction perpendicular to the direction of propagation of the beamlets, e.g. in a direction into and out of the paper.

The total current of the beamlets required to achieve a particular throughput in a lithography system, i.e. a particular number of wafers exposed per hour, depends on the required dose, the area of the wafer, and the overhead time, i.e. the time to move a new wafer into position for exposure. Among others, the required dose in these shot noise limited systems depends on the required feature size and uniformity, and beam energy.

To obtain a certain feature size, i.e. critical dimension (CD), in resist using electron beam lithography, a certain resolution is required. This resolution is determined by three contributions: beam size, resist scattering of electrons, and secondary electrons mean free path combined with acid diffusion. These three contributions add up in a quadratic relation to determine a total spot size, i.e. a beam size projected on the target to be exposed. Of these three contributions the beam size and the scattering depend on the acceleration voltage. To resolve a feature in the resist the total spot size should be of the same order of magnitude as the CD. Not only the CD but also the CD uniformity is important for practical applications.

For electron beam systems, the maximum single beam current is determined by the spot size. To obtain a good CD uniformity, the required spot size will limit the single beam current to much less than the current required to obtain a high throughput. Thus a large number of beamlets is required (typically more than 10,000 for a throughput of 10 wafers per hour). For an electron beam system, the total current through one lens is limited by Coulomb interactions between electrons, so that a limited number of beamlets can be sent through one lens and/or one cross-over point. This consequently means that the number of lenses in a high throughput system also needs to be large.

So preferably, a very dense arrangement of a large number of low energy beamlets is achieved, such that the multiple beamlets can be packed into an area comparable in size to the size of a typical wafer exposure field.

Consequently, the pitch of the apertures in the plates 12, 13 and 14 of the projection lens is as small as possible to create as many electrostatic lenses as possible in a small area. However, reduction in the pitch for a given bore size of the apertures is limited by manufacturing and structural problems caused when the plate becomes too fragile due to the small distances between the apertures, and by possible aberrations in a lens caused by fringe fields of neighboring lenses.

By increasing the current in the system, the total current on the target is also increased to limit development of shot noise. At the same time, however, in order to maintain performance, the number of electrons impinging on the target surface per square critical dimension, i.e. per unit of area of CD squared should be maintained constant. It is remarked at this point that spot size in practice corresponds to, and is, as an easier to conceive term, in the remainder of the text used in stead of "point spread function".

Not only a reduced spot size, but also a reduced point spread function of beamlets is desired to maintain sufficient exposure latitude at an increased current. Sufficient exposure latitude requires a relatively high ratio of peak exposure level on the target from a beamlet compared to base or background level of exposure as normally caused by the peripheral Gaussian parts of neighboring beamlets. Designing a system to generate beamlets having a smaller point spread function, however, considerably reduces the charged particle current that may be applied to the target by each beamlet. Irrespective of the brightness of the charged particle source used, the preceding requirements of reduced spot size, increased current, and reduced point spread function imply a considerably more than linear increase in the number of beamlets in the system compared to the reduction in critical dimension at the same wafer throughput.

As mentioned earlier, there is a limit to the number of lenses that may be physically realized within a relatively small area that the projection optics, i.e. end module 7 in FIG. 1, may occupy in practical designs. At reduced CD to be achieved, the number of lenses that can be constructed within these dimensions using known techniques is considerably smaller than the number of beamlets required to achieve the desired wafer throughput.

Figure 4:
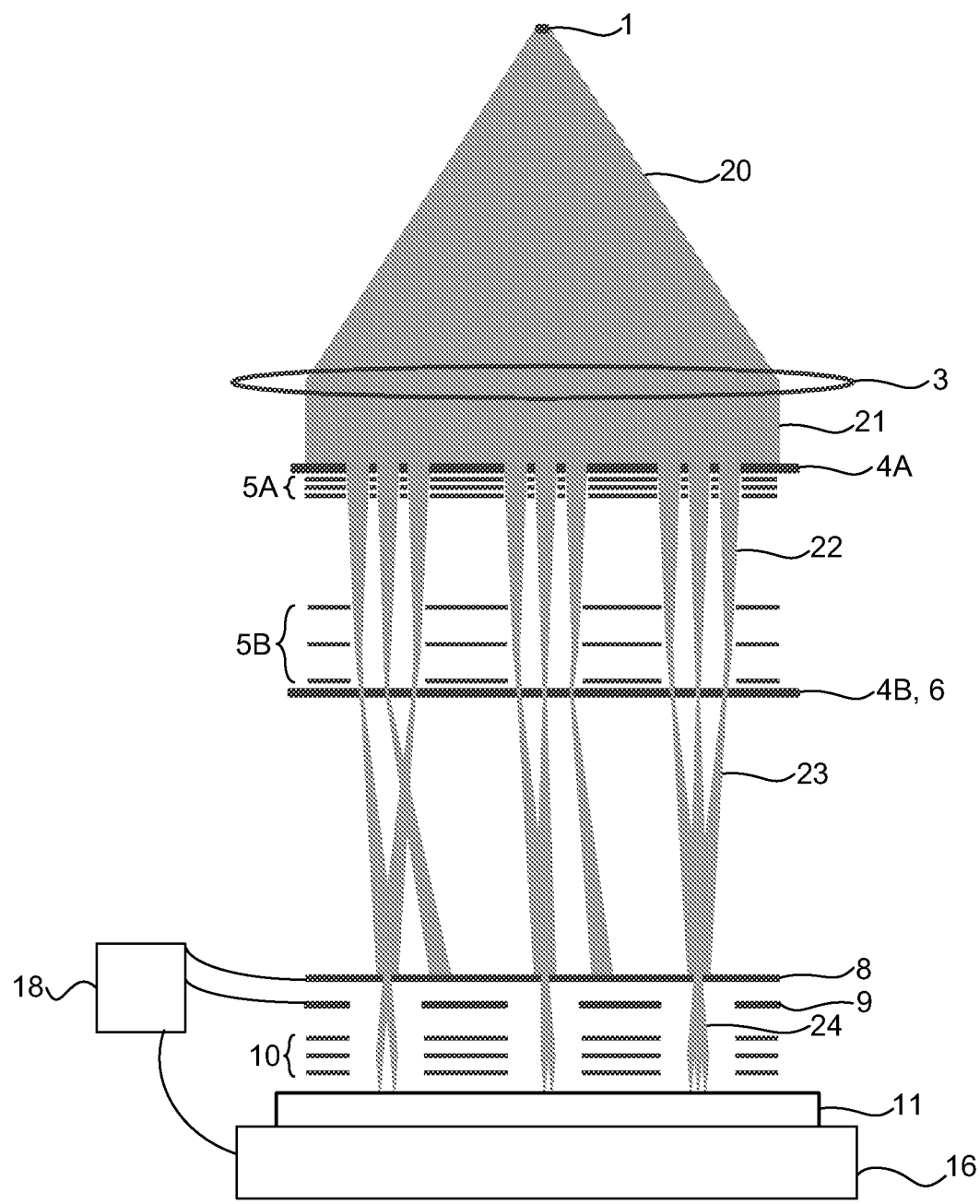
FIG. 4 is a simplified schematic overview of an alternative embodiment of a charged particle multi-beamlet lithography system including grouped beamlets.

A lithography system which provides a solution for aforementioned problems to achieve reasonable throughputs at reduced CD is discussed in U.S. patent application 61/045,243. An embodiment of the lithography system presented in this application is schematically shown in FIG. 4. Embodiments of the lithography system presented in aforementioned application minimize aberration in the system while allowing a disproportionate increase in the number of beamlets in the system. This principal solution using multiple beamlets per projection lens was found after recognition of the fact that with the deflecting action of deflector array 9 in the end module 7, a virtual point of origin of the deflected beamlet is created, so that a virtual beamlet was imagined.

Figures 3A, 3B:
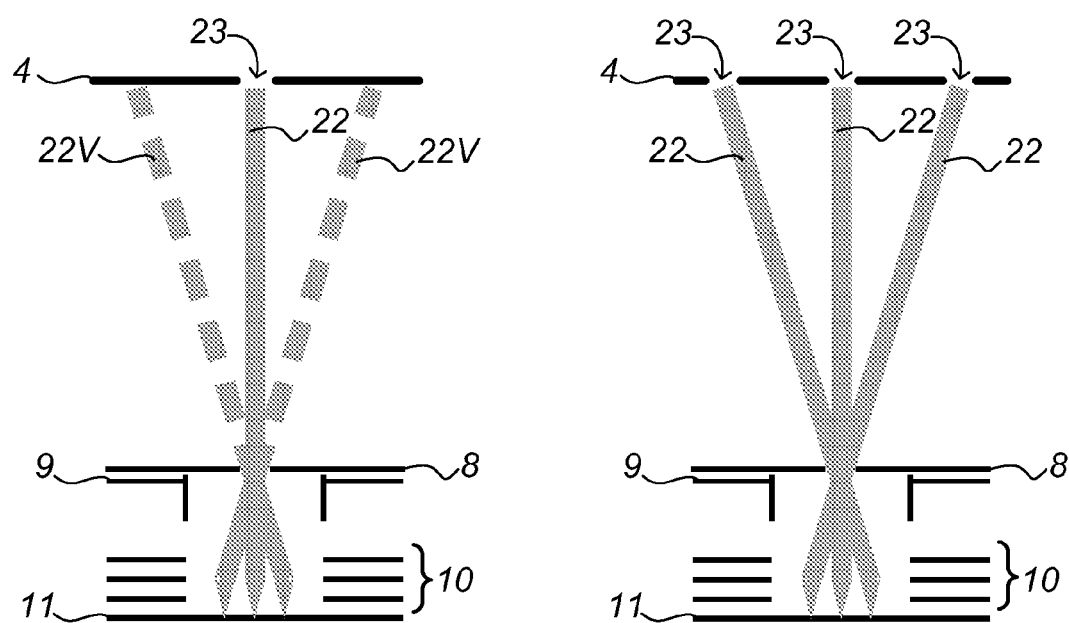
FIGS. 3A and 3B are conceptual diagrams illustrating the concept of multiple beamlets per projection lens.

FIGS. 3A and 3B are schematic diagrams of the path of beamlets in the end module 7, to illustrate aforementioned insight underlying using multiple beamlets per projection lens.

FIG. 3A shows a system having a single beamlet per projection lens system. A single beamlet 22 passes through an aperture in the beam stop array 8, is deflected by deflector array 9, and focused by a projection lens arrangement 10. The deflected beamlet can be considered as a separate 'virtual' beamlet arriving at an inclined angle from a different origin than the actual beamlet 22. For example, when beamlet 22 is deflected to the left, it can be regarded as a virtual beamlet 22V originating from a location to the right of the actual origin of beamlet 22, and similarly when beamlet 22 is deflected to the right, it can be regarded as a virtual beamlet 22V originating from a location to the left of the actual origin of beamlet 22.

FIG. 3B shows a system having three beamlets per projection lens system, each beamlet originating from a separate point and passing though a projection lens system at different angles. Hence, in accordance with an insight of the present invention, virtual beamlets 22V in FIG. 3A have been replaced by real beamlets 23. The application of multiple real beamlets through a single projection lens system appears to be possible without disturbing the amount of aberration. This is especially the case where all beamlets present in the lithography system are distributed over a multiplicity of projection lens systems.

As compared to FIG. 3A, which uses a single deflected beamlet, the net effect is the same, except that the current through the projection lens is three times greater in the system of FIG. 3B. Aperture plate 4 above the deflector array 9 may comprise a multiplicity of apertures 23 as depicted i.e. may have a patterned opening to accommodate the multiple beamlets 22 that correspond to a single lens system associated with on opening in beam stop array 8. Note that in a real design, the beam angle is much smaller than shown in FIGS. 3A and 3B. The relatively large beam angle shown in FIGS. 3A and 3B is merely present to clarify the invention.

Because part or all of the plurality of beamlets directed through to a each projection lens system may be blanked at any point in time during operation, a system encompassing aforementioned principle may in this description be referred to as a patterned beamlet system. Such a patterned beamlet system may also be regarded as a multiplicity of miniaturized imaging systems arranged side by side.

FIG. 4 illustrates an embodiment of a charged particle multi-beamlet lithography system including grouped beamlets. This embodiment is able to accommodate an increased number of beamlets in the system, permitting increased current at the wafer and/or reduced spot size.

The embodiment shown in FIG. 4 is constructed generally as described for the system of FIG. 1, except that the beamlets are arranged in groups so that multiple beamlets may be focused by a single projection lens system. In this embodiment, an aperture array 4A produces beamlets 22 from the collimated beam 21. The beamlets 22 are focused by condenser lens array 5A in the plane of a second aperture array 4B. The second aperture array 4B may be separate from or combined with a beamlet blanker array 6.

The beamlets 22 are arranged as groups, and a second condenser lens array 5B focuses each group of beamlets towards a corresponding aperture in beam stop array 8. The beamlet blanker array 6, which may be integrated with the second aperture array 4B or constructed separately, comprises an array of blanker elements with electrodes formed at the location of each aperture in beamlet blanker array 6. Each blanker element operates to deflect a beamlet 22 in a group of beamlets.

Although three beamlets per projection lens system is shown in FIG. 4, other numbers of beamlets per projection lens system may also be used, and groups of up to 100 beamlets or more can be directed through each projection lens system. In a preferred embodiment, groups of 49 beamlets in an array of 7 by 7 are deflected through each projection lens system.

The apertures in the beam stop array 8, which define the beamlet opening angle, may be relatively small as if they were limiting only a single beamlet. Larger apertures would require a larger deflection path, would be more susceptible to "tail" effects caused by only partial blanking of a blanked beamlet, and would further reduce the limited space available on beam stop array 8 for blanking beamlets.

In principle each group of beamlets can be converged, i.e. directed to a single point, i.e. spot, where they intersect and cross-over, either at the relevant aperture of beam stop array 8, or at the effective lens plane of the relevant projection lens system. In practice the convergence will be somewhere between these two points (although not further depicted in the drawings), since converging the beamlets at the beam stop array would create a lens error while converging the beamlets at the effective lens plane of the projection lens would cause a dose error.

In this embodiment of a charged particle multi-beamlet lithography system multiple beamlets pass through each projection lens system. The charged particle optics slit does not consist of a regular array of beamlets but of a regular array of groups of beamlets. As discussed in U.S. patent application 61/045,243, at any instant some of the beams in a group may be directed through a corresponding opening in beam stop array 8 and projected onto the target, while other beamlets are deflected an additional amount. This additional deflection causes these beamlets to miss the opening in beam stop array 8 so they are blocked from reaching the target, and are thereby blanked or "switched off" as described previously. Thus, each group of beamlets exposes a pattern determined by the beam blanker array 6, and each group can be considered as a single patterned beamlet.

Figure 5:
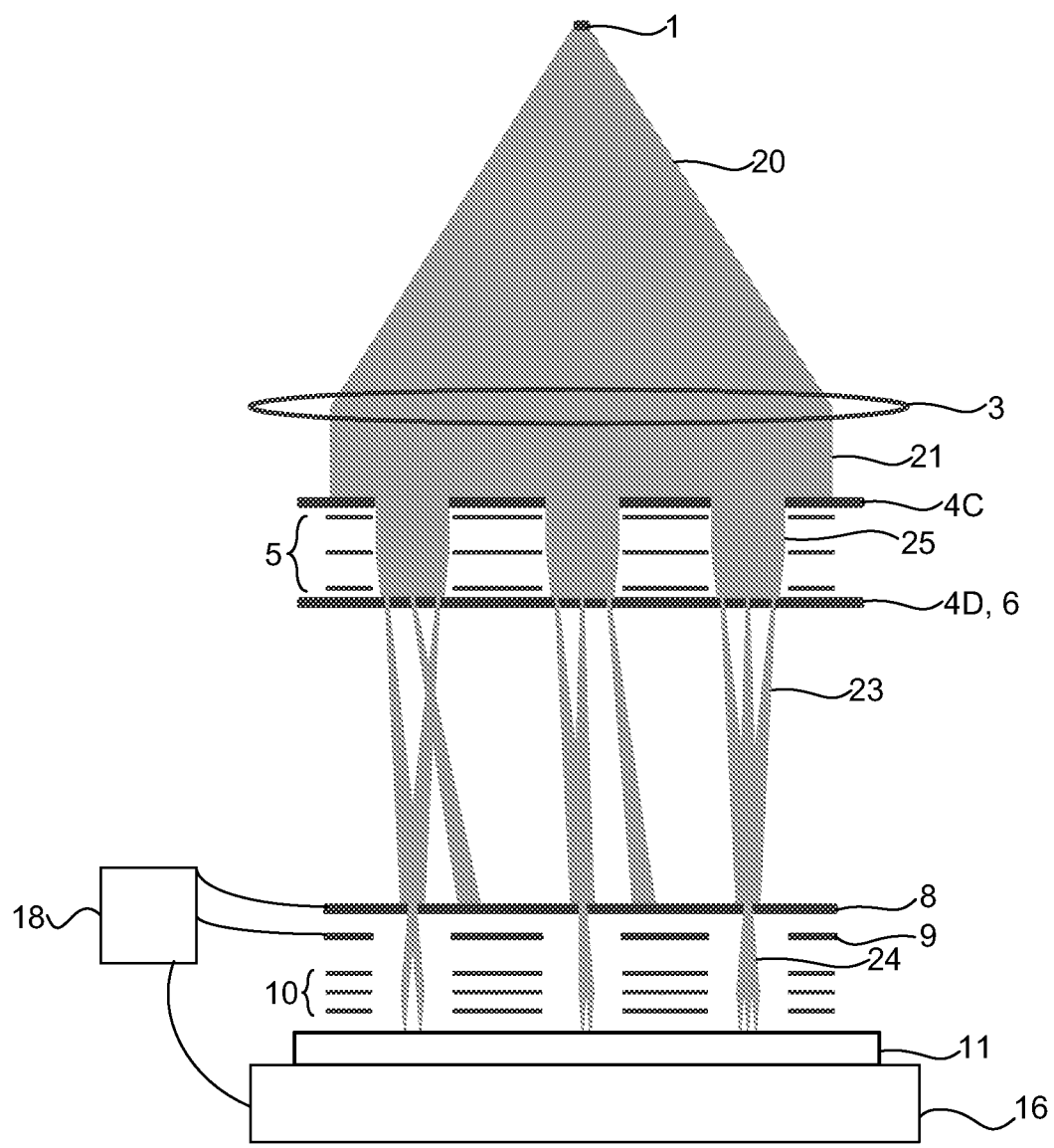
FIG. 5 is a simplified schematic overview of an embodiment of the charged particle multi-beamlet lithography system including beamlets formed from sub-beams.

FIG. 5 illustrates a simplified schematic overview of an embodiment of the charged particle multi-beamlet lithography system including beamlets formed from sub-beams. While the system of FIG. 4 provides for multiple beamlets per projection lens system, it also results in a complex system requiring two sets of condenser lens arrays 5A and 5B. Furthermore, manufacturing the condenser lens array 5A is difficult as it comprises relatively small openings at a fairly small pitch. The lithography system of FIG. 5 is less complex, and as a result of a decrease in the number of components, has a reduced column length as compared to the lithography system illustrated in FIG. 4. Due to the decreased column length, a smaller vacuum chamber may be used. Such a vacuum chamber is not only less expensive, but it can also be pumped out in a shorter period of time, i.e. its pumping time is limited. Furthermore, the path length of the beamlets is decreased, resulting in a decrease of misalignment due to beamlet drift.

The system of FIG. 5 includes an aperture array 4C to produce larger sub-beams 25. The sub-beams pass through a condenser lens array 5 focusing the sub-beams approximately in the plane of beam stop array 8 and towards a corresponding opening in beam stop array 8. In principle each sub-beam can be focused either at the corresponding opening in beam stop array 8, or at the effective lens plane of the corresponding projection lens system. In practice it is preferred to focus the sub-beams somewhere between these two points. This results in the aperture array 4C being imaged onto the target 11. It should be noted that the condenser lens array (in any of the embodiments) may comprise a single condenser lens array or a set of condenser lens arrays, as would be known to a person of skill in the field of electron-optics.

The sub-beams 25 are intercepted by aperture array 4D which includes a number of apertures in the path of each sub-beam, producing a group of beamlets 23 from each sub-beam 25. The groups of beamlets, formed from the sub-beams, are also focused approximately in the plane of beam stop array 8 and each group of beamlets is directed towards a corresponding opening in beam stop array 8.

These beamlets 23 then pass through beamlet blanker array 6. Blanked beamlets are blocked by beam stop array 8, while unblanked beamlets in each group pass through a corresponding opening in beam stop array 8 and are subsequently projected onto the target by projection lens arrangement 10. In the example shown in FIG. 5, the aperture array 4D produces a group of three beamlets 23 from each sub-beam 25. The group of beamlets, if undeflected by beam blanker array 6, strike the beam stop array 8 at a corresponding opening so that the three beamlets are projected onto the target by the projection lens system 10. In practice, a much larger number of beamlets may be produced for each projection lens system 10. In a practical embodiment, as many as 50 beamlets may be directed through a single projection lens system, and this may be increased to 200 or more.

As shown in FIG. 5, the beamlet blanker array 6 may deflect individual beamlets 23 in a group of beamlets at certain times in order to blank them. This is illustrated in FIG. 5 by the left-hand sub-beam 25, in which the middle beamlet 23 has been deflected to a location on the beam stop array 8 near to but not at an opening so that the beamlet is blanked. In the middle sub-beam 25 the right-hand beamlet 23 has been deflected and is blanked, and in the right-hand sub-beam 25 no beamlets are deflected and blanked.

As schematically shown in FIGS. 4 and 5, a control unit 18 is arranged to actuate movement of a substrate support member or stage 16 arranged for supporting the target 11 to be exposed, e.g. a wafer. This movement is referred to variously in this description as a movement in a first direction or the X-direction or the mechanical scan direction. The movement in the X-direction can be achieved in a variety of ways: the target moves by mechanical movement of the substrate support member, the rest of the system moves, the beamlets are deflected, or any combination of the above techniques.

As mentioned with respect to FIG. 1, the patterned beamlets formed in the charged particle multi-beamlet lithography systems shown in FIGS. 4. and 5 are moved by a deflector array 9. This movement of the beamlets, in this case the deflection of charged particle beamlets by the electrostatic deflector array 9, is performed in a second direction, the second direction being different than the first direction. This second direction is referred to variously in this description as the Y-direction or deflection scan direction. In one embodiment of the invention, the first direction is substantially perpendicular to the second direction. Please note that the movement of the beamlets in the second direction is generally a repetitive movement, i.e. a beamlet is scanned from a starting position over a certain distance until an end position and then moved back again to the starting position. Hence, the movement of the beamlets in the second direction may be performed with a certain frequency.

Figure 6:
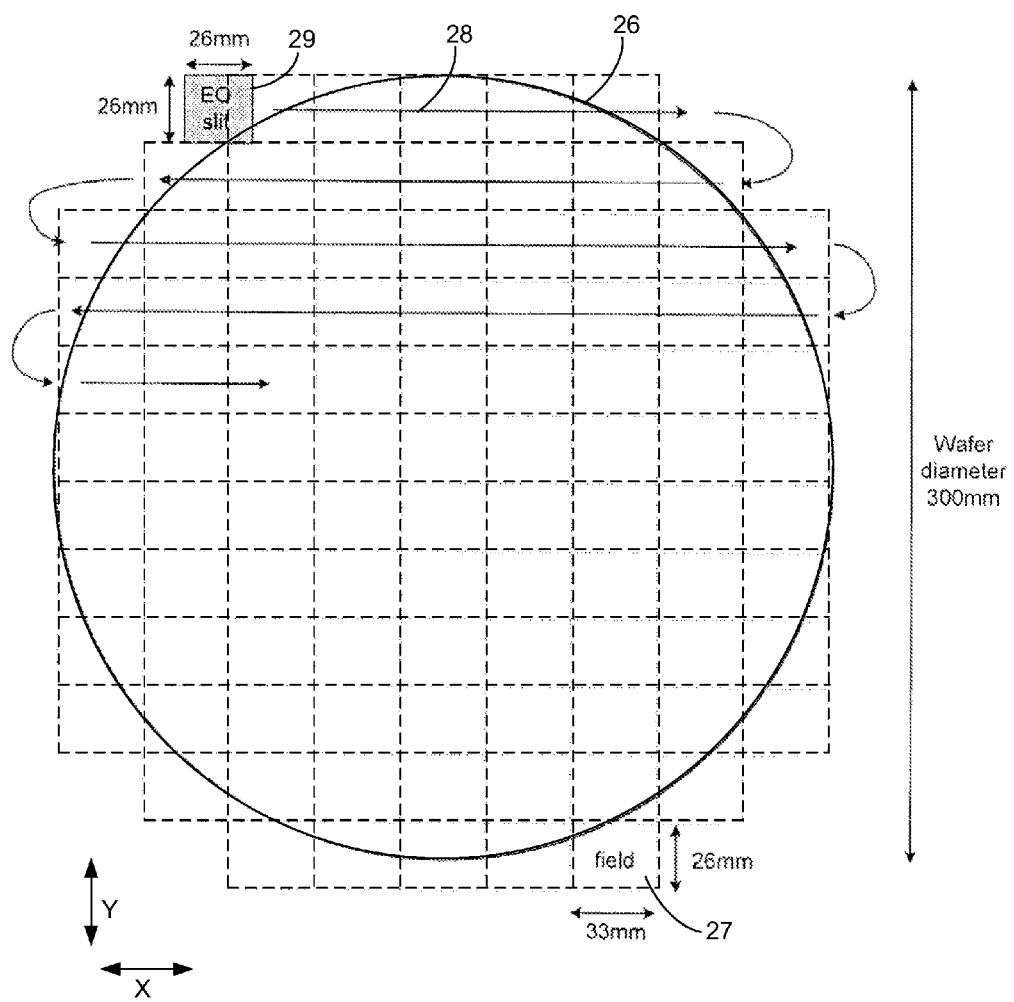
FIG. 6 is a diagram of an example of a wafer divided in to fields.

As mentioned previously, for lithography applications, the target usually comprises a wafer provided with a charged-particle sensitive layer or resist layer. The current industry standard is a 300 mm wafer. Wafers are typically divided into fixed size fields with a maximum dimension of 26 mm×33 mm. Each field may be processed to produce multiple integrated circuits (i.e. the layout for multiple chips may be written into a single field) but the ICs do not cross a field border. With a maximum size of 26 mm×33 mm there are 63 fields available on a single standard wafer. Smaller fields are possible and will result in a higher number of fields per wafer. FIG. 6 shows a wafer 26 divided into fields 27, and the direction of writing the fields 28. It is possible to write partial (incomplete) fields, for example by writing full fields into the partial fields and crossing the wafer boundary.

In a preferred embodiment of the lithography machine, the machine generates 13,000 sub-beams and each sub-beam is split into 49 beamlets arranged in a 7×7 array, resulting in 637,000 beamlets (i.e. 13,000×49). When this arrangement is applied in the machine of FIG. 5, the aperture array 4C contains 13,000 holes and the aperture array 4D and beamlet blanker array 6 contain 637,000 holes, which form the electron-optical (EO) slit in an area of 26×26 mm (i.e. the size of the complete array of beamlets as projected onto the wafer). Each sub-beam comprising 49 beamlets writes a single stripe in each field in the X-direction. The 13,000 sub-beams arranged over a distance of 26 mm (i.e. the width of the EO slit) result in a stripe of width 2 μm in the Y-direction (substantially perpendicular to the mechanical scan) and a stripe length as long as the field in X-direction (e.g. 33 mm in the example of FIG. 6).

The wafer is preferably written on (exposed) by the lithography machine in both a backward and forward X-direction, for example as shown in FIG. 6. The direction of writing in the Y-direction (by the deflector array) is usually in one direction.

When the size (height) of a field is chosen to be smaller than the size of the electron-optical (EO) slit (i.e. the size of the complete array of beamlets as projected onto the wafer) (e.g. smaller than the maximum size of 26 mm), then more fields can be placed on the wafer, but not all of the electron beamlets will be used to write on the wafer. The EO slit will need to cross the wafer more often to write all fields and the overall throughput will decrease. Therefore, the EO slit preferably has a size that coincides with the size of a field.

When a machine is writing patterns to a field, at some moment the beamlet blanker array enters the next field and starts writing patterns in it, so the machine should be able to write in two fields at the same time. If a field is sufficiently small, the machine should be able to write 3 fields at the same time.

Figure 7A:
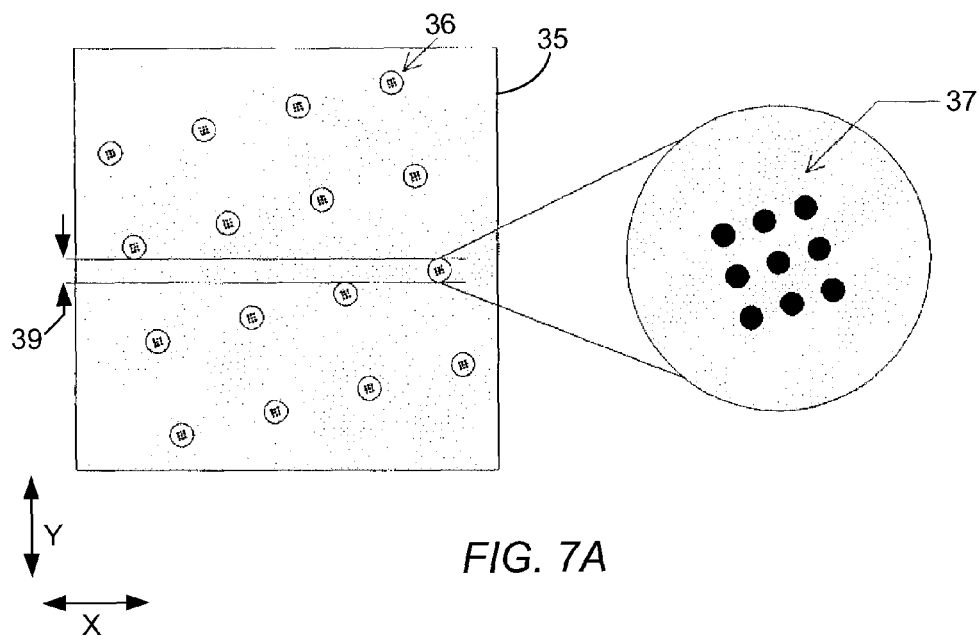
FIGS. 7A and 7B are diagrams showing alternative beamlet aperture arrangements for a simplified beamlet blanker array.
Figure 7B:
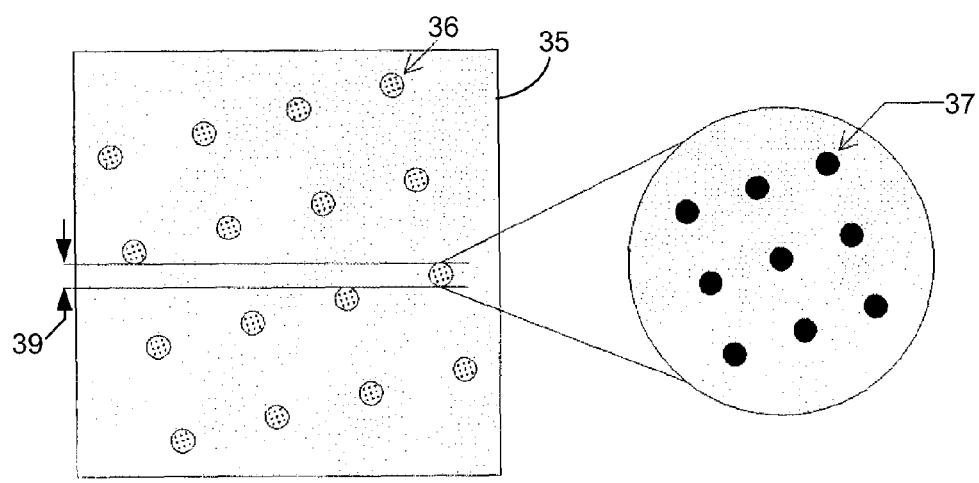

A simplified version of a beamlet blanker array 35 is shown in FIGS. 7A and 7B, for a machine having 16 sub-beams arranged in a 4×4 array, and each sub-beam having 9 beamlets arranged in a 3×3 array. For each sub-beam there is a group of apertures 36 with an associated blanker electrode for each beamlet aperture. An expanded view of one group of apertures 37 is shown on the right side of the drawings.

In FIG. 7A an arrangement of blanker apertures is shown suited to a parallel projection writing strategy, while in FIG. 7B an arrangement is shown suited to a perpendicular writing strategy. In FIG. 7A the blanker apertures for the beamlets of each sub-beam are grouped closer together. In FIG. 7B the blanker apertures for the beamlets are distributed evenly over the full stripe width 39, i.e. each beamlet is positioned equidistant from the neighboring beamlets (whether from the same sub-beam or a different sub-beam) in a Y-direction substantially perpendicular to the mechanical scan direction. This is possible, but for a low number of apertures the efficiency of this arrangement in terms of the ratio between the beam and beamlet current will be extremely low. A measure for the efficiency is the fill factor, which is the ratio between the total area of the blanker apertures and the area in which the apertures for one sub-beam are grouped. The fill factor is useful for evaluating the efficiency of a particular grid geometry in terms of current in (beam current) and current out (sum of beamlet currents). When the area of the group of beamlet apertures is smaller, the fill factor will increase to more preferred values.

A writing strategy that works well for a small number of apertures is the "parallel projection" writing strategy, where (in its simplest form) the individual beamlets are interleaved and write the full stripe width. For example, in the lithography machine discussed above, a number of apertures for which the parallel writing strategy would be suitable would be in the order of 750,000 or smaller. As will be explained later in further detail, a parallel writing strategy refers to a writing strategy in which a direction of the sequence of projected beamlets is parallel to a (mechanical) scan direction of a wafer stage.

It is assumed that an ideal grid exists on the wafer and that the electron beamlets can be positioned substantially on the grid coordinates. Assuming that an acceptable exposure pattern is created on the target when the electron beamlets can be positioned within 1/20th of the minimum feature size (the CD), then to write a square having a side equal to the CD, 20 scan lines and thus 20*20=400 grid points are needed. Thus, if the CD equals 45 nm, in this embodiment the positioning is controllable within a range of 2.25 nm. Details with respect to positioning of features by means of gray writing, and with respect to correction for positioning errors by means of timing can be found in U.S. Pat. No. 6,897,458.

Figure 8:
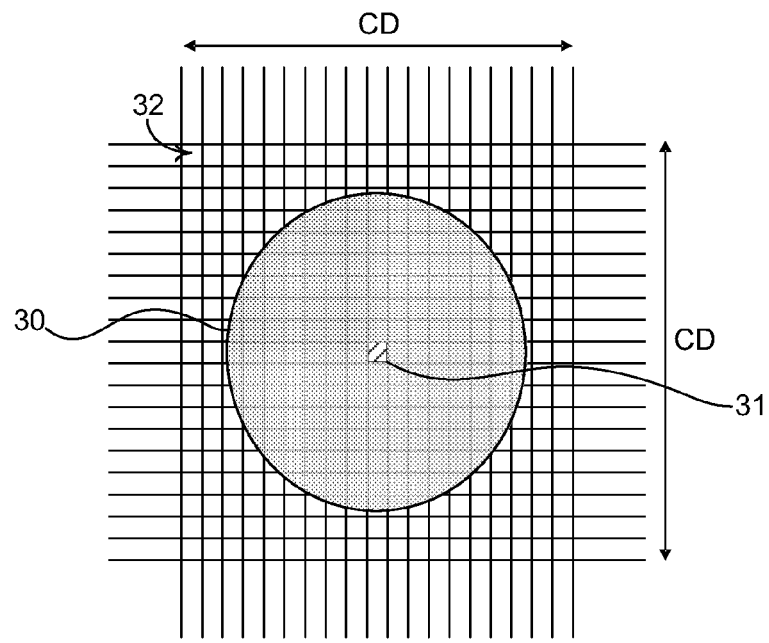
FIG. 8 schematically shows a beam spot size projected on a target surface within a square raster portion of a size concurring to a typical width.

FIG. 8 shows a beamlet size 30 of a charged particle beamlet projected onto a target surface within a portion of a virtual grid covering an area of a typical desired critical dimension (CD).

In order to expose the target with an exposure pattern, the pattern data may be rasterized corresponding to a virtual grid on the surface of the target. In a typical arrangement, the target is moved while the beamlets are scanned in a direction substantially perpendicular to the stage motion. The rasterized pattern data is supplied to the multi-beamlet system, timed so that the beamlets are modulated in synchronism with the beamlet deflection and target motion, so that the pattern represented by the pattern data is transposed as an exposure pattern onto the surface of the target. Although the virtual grid is typically a Cartesian grid, other types of grid are also possible.

The size of the grid used may be determined by considering whether an unintentional modulation or misalignment of a single charged particle beamlet would be disturbing to the pattern to be exposed on the target. A tendency exists to choose the grid as small as possible, due to the desire to have a virtually infinite choice in designing line or object width or determining positioning of a feature to be formed on the target. The latter would, in accordance with an insight underlying the present invention, mean an additional possibility for correcting proximity effects at writing. On the other hand, it is desired to have the grid as large as possible, particularly in multi-beam systems having a large number of beamlets, in order to limit the amount of data to be processed and transferred to the system.

As a balance between the above described conditions and as a reflection of the state of contemporary technology, one embodiment of a multi-beamlet system discriminates so-called critical dimension cells, typically e.g. 45 nm. These cells may be exposed by charged particle beamlets having a beam size of a corresponding order, e.g. 30 nm. The cells may be divided into a plurality of grid cells, e.g. 20 by 20 grid cells, thus having a small dimension relative to the beam size, e.g. 2.25 nm. In such an arrangement, an accidental blanking or not blanking of a single grid cell would only have a negligible effect. The plurality of grid cells form a virtual grid. The position of the projected beamlet size 30 in FIG. 8 on the virtual grid corresponds to grid cell 31.

Since the projected beamlet size 30 of the beamlet in FIG. 6 is much larger than the size of a single grid cell 32, e.g. 2.25 nm (also referred to as the pixel size), edge shapes are largely invisible after developing an exposed pattern. Furthermore, a hatched, i.e. ragged, edge in a rasterized pattern may effectively shift the position of the eventual feature edge, as is in more detail explained in US patent application publication no. 2008/073588. The possible accuracy of placement using the aforementioned technique of ragged edges depends on the size of the ragged edge pixels length compared to the beam size 30. Optimization may result in an accuracy of less than 1/10 of the pixel size.

Figure 9:
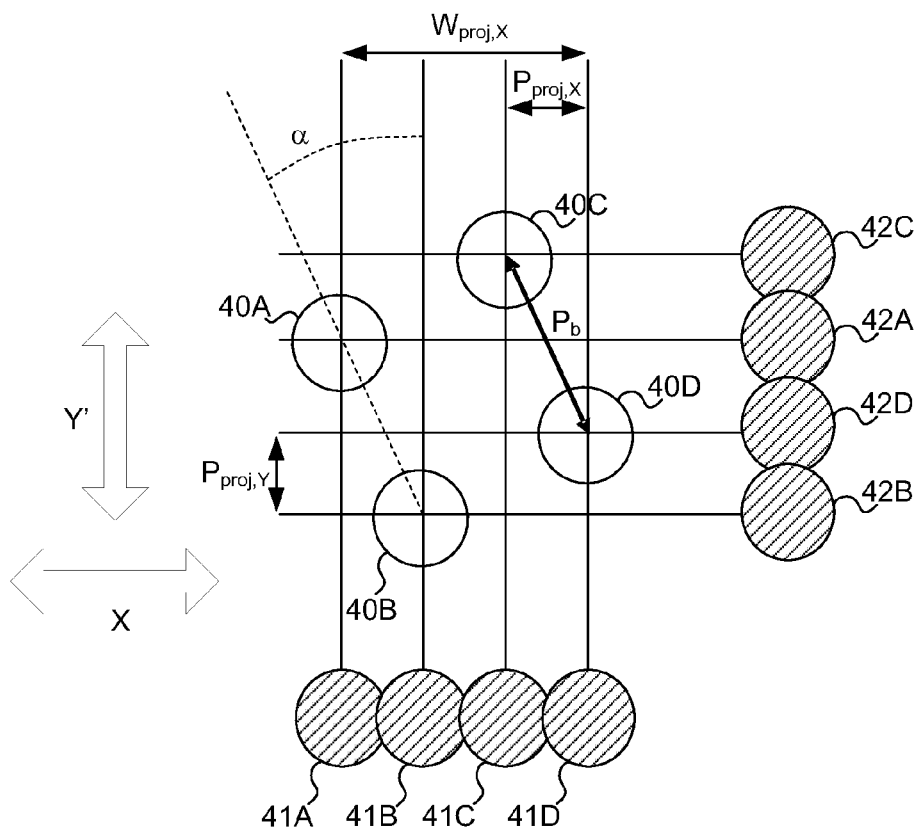
FIG. 9 schematically shows the concept of projecting a group of beamlets projected on a target surface to be exposed.

FIG. 9 schematically shows the concept of projecting a group of beamlets 40A, 40B, 40C, 40D onto a plane in a X-direction or a Y-direction. The group of beamlets is arranged in an array as projected on a target surface to be exposed. This concept is used in embodiments of the invention. In FIG. 9, the group of beamlets 40A-40D comprises an array consisting of 2 columns and 2 rows. The distance between the beamlets, also referred to as pitch, is equal to $P_b$. The beamlets may be moved in the X-direction, e.g. the mechanical scan direction, and the Y-direction, e.g. the deflection scan direction. A combination of movement in these directions may be used in embodiments of the invention.

At least one of the rows and columns is positioned at an angle unequal to 90° with respect to the first direction and the second direction. In the example shown in FIG. 9, the columns formed by beamlets 40A, 40B and 40C, 40D are positioned at an angle α with respect to the Y-direction.

The beamlets 40A-40D may be projected in the Y-direction onto a plane parallel to the X-direction, resulting in a sequence of beamlet projections 41A-41D (shown as hatched circles) aligned in a direction parallel to the X-direction. The pitch in this projection (i.e. distance between the beamlets when projected onto a plane parallel to the X-direction) is denoted by $P_{proj,X}$, and this is referred to hereafter as the projection pitch in the X-direction. The pitch $P_{proj,X}$ can be calculated by the equation $P_{proj,X}=P_b \cdot \sin(\alpha)$. The grid width $W_{proj,X}$ for the group of beamlets is also shown.

Similarly, beamlets 40A-40D may be projected in the X-direction onto a plane parallel to the Y'-direction, resulting in a sequence of beamlet projections 42A-42D (shown as hatched circles) aligned in a direction parallel to the Y'-direction. The pitch in the projection is denoted by $P_{proj,Y}$, and this is referred to hereafter as the projection pitch in the Y'-direction.

In this description, several embodiments of methods of exposing a target by means of a plurality of beamlets will be disclosed. The methods can be divided in two categories. A first category, in which the projection pitch $P_{proj,X}$, is taken into account, will be referred to as a writing strategy of the parallel type. The expression "parallel" here refers to the direction of the sequence of projected beamlets with respect to the X-direction (e.g. mechanical scan direction). A second category, in which the projection pitch $P_{proj,Y}$ is taken into account, will be referred to as a writing strategy of the perpendicular type.

As mentioned earlier, a target is exposed in a desired pattern by means of a plurality of beamlets by simultaneous movement of the plurality of beamlets relative to the target in a first direction (e.g. a mechanical scan direction) and second direction (e.g. deflection of the plurality of beamlets in a second deflection scan direction). The two directions are not the same. For convenience the drawings show the two directions as being perpendicular. However, in a preferred embodiment the two directions are substantially (but not exactly) perpendicular. This is indicated in the drawings by reference to the Y'-direction. The Y'-direction is slightly tilted with respect to the Y-direction, so that movement of the beamlets in the Y'-direction is coordinated with the simultaneous relative movement of the beamlets and target in the X-direction, resulting in the end of a scan line for a beamlet being at approximately the same position in the X-direction as the beginning of the next scan line for that beamlet. The amount of tilt depends on the amount of movement in the Y-direction during the exposure of a single scan line in the X-direction.

The discussion of embodiments of the invention will be illustrated for an array of 2×2 beamlets per projection lens system (i.e. per sub-beam). Although four beamlets per projection lens system are shown, other numbers of beamlets per projection lens system may also be used. Groups of up to 100 beamlets or more can be directed through each projection lens system. Furthermore, although an array is shown in which the number of column equals the number of rows, other array configurations may be used in embodiments of the invention. Hence, an array may comprise n rows×k columns, n and k being integers not equal to each other. Furthermore, although a square array is shown, other arrangement may be used, such as a triangular, hexagonal, or other type of array.

In a preferred embodiment the beamlets are charged particle beamlets, preferably electron beamlets, but other types of beamlets suitable for exposing a target may also be used.

Finally, note that the drawings do not give an accurate representation of the ratio between dimensions in the X-direction and Y'-direction. In particular, the scan lines in the Y'-direction have been shortened to enhance clarity, especially with respect to effects occurring at the ends of a scan line.

Figure 10:
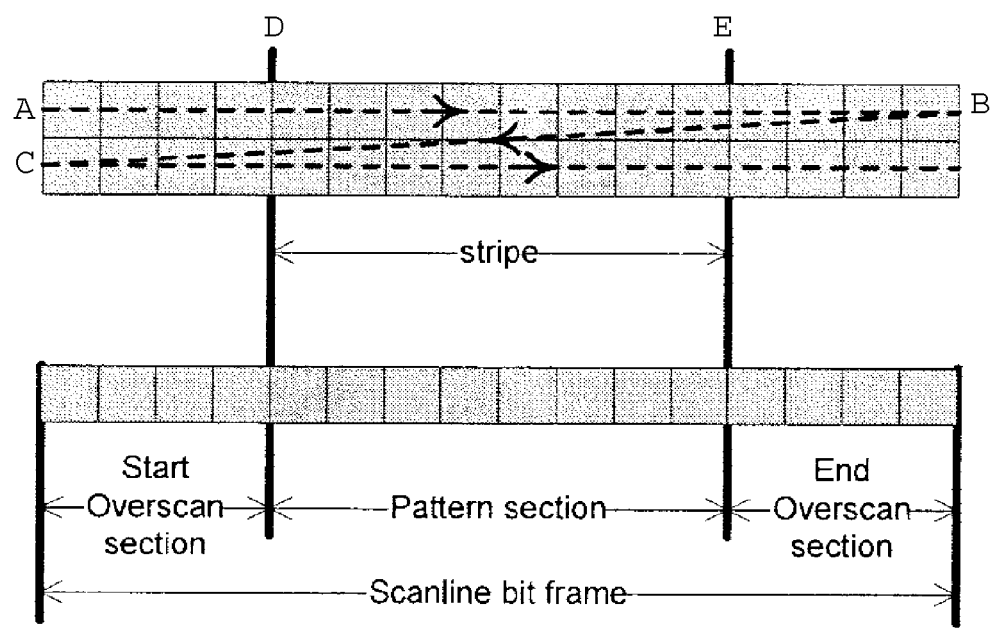
FIG. 10 is a schematic diagram showing a beamlet scan line.

FIG. 10 shows a schematic diagram of a scan line of a beamlet. The beam deflector array generates a triangular shape deflection signal for all beamlets in parallel. The deflection signal includes a scan phase (from A to B) and a fly-back phase (from B to C), as shown in the schematic diagram in FIG. 10. During the scan phase, the deflection signal slowly moves the beamlet (when switched on) in the Y'-direction and the beamlet blanker array will switch the beamlet on and off according to the beamlet control signals. After the scan phase the fly-back phase starts. During the fly-back phase, the beamlet is switched off and the deflection signal quickly moves the beamlet to the position where the next scan phase will start.

A scan line is the path of a beamlet on the surface of the wafer during the scan phase. As mentioned above, in certain embodiments, without special measures the scan line would not write exactly along the Y-direction on the wafer, but will be slightly skewed with a small X-direction component as well because of the continuous stage movement in the X-direction. This error may be corrected by adding a small X-direction component to the deflection field to match the stage movement. This X-direction component is typically small because the stage movement is slow in comparison to the Y-direction deflection scan speed (a typical x:y relative speed ratio may be 1:1000). However, the effect of this X-direction component is greatly increased in systems with patterned beams (e.g. multiple beamlets for each sub-beam). Firstly, the deflection speed may be reduced in proportion to the number of beamlets per patterned beam (sub-beam). Secondly, due to the inclination of the array of beamlets (as shown, for example, in FIGS. 7A, 7B), a skew in the scan lines on the wafer will result in altering the distance between scan lines made by different beamlets. A large enough skew may result in scan lines overlapping or changing position with respect to each other.

A scan line (see FIG. 10 at the right) is divided into three sections: a start overscan section, a pattern section, and an end overscan section. Beamlets are deflected along the Y'-direction across the width of a stripe. The distance in which the beamlets are deflected is typically wider than the actual stripe to be written. Overscan provides space for shifting and scaling the positions where the beamlet writes. Overscan is the single sided surplus. In case of a stripe width of 2 μm and an overscan of 0.5 μm (or 25%) this results in a scan line length of 3 μm. During the overscan sections the beamlets are typically switched off.

In FIG. 10 (at the left) a scan line is depicted for the situation where only one beamlet is writing a stripe. The path of the beamlet during a deflection cycle is A-B-C. AB is the scan line movement during the scan phase, while BC is the fly-back during which the beamlet is switched off. The stripe borders are marked D and E. At the right side in FIG. 10 the overscan and pattern sections are identified. The total set of bits of the beamlet control signal received by the beamlet blanker array for switching the beamlet over the scan line is called the scan line bit frame.

During the entire scan line the beamlets are controlled by the lithography system. In the overscan section the beamlets will be switched off. In the pattern section the beamlets are switched according to the features required to be written in the wafer field. The bits in the scan line bit frame for both the overscan section and pattern section represent data to be transferred to the beamlet blanker array. The bits/pixels in the overscan section seem to be useless and consuming bandwidth of the data path. However, the bit/pixels in the overscan section can provide room for corrections (such as pattern shift and pattern scaling), provide room for stitching algorithms, and provide room for differences in y-positions of blanker holes for beamlets when writing strategies are used where all beamlets write the full stripe width (parallel projection). Assuming a fixed bit rate for the beamlet control signals which control the beamlets and a certain pixel size, the scan line can be mapped into a fixed length bit frame, referred to as the scan line bit frame.

Figure 11:
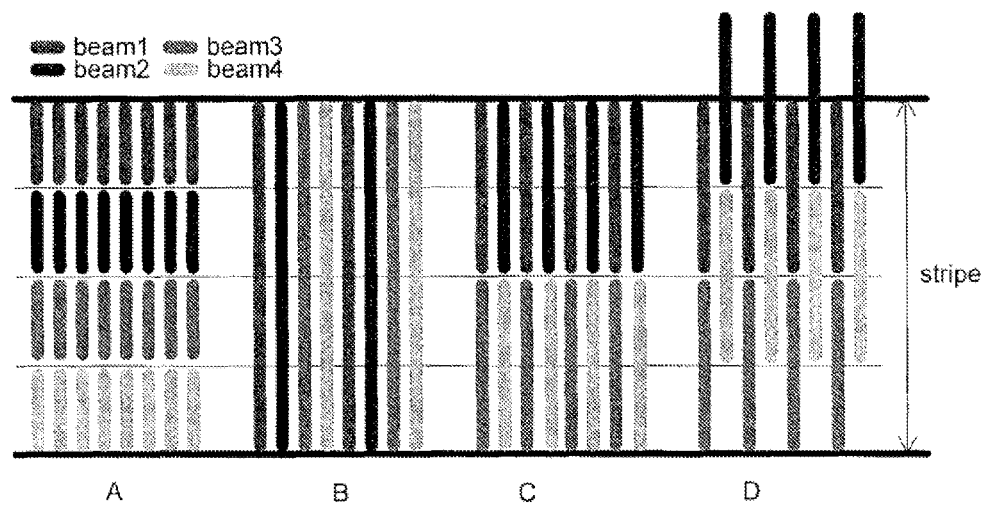
FIG. 11 is a diagram of four possible writing strategies.

In a preferred embodiment, each sub-beam is split into 49 beamlets for writing one stripe of a field. There are many different writing strategies for writing the stripe. The beamlet writing strategy defines in what way the beams are arranged for writing a stripe. The scheme could be combinations of stacking, interleaving or overlapping. In FIG. 11 several examples are shown as possible interleaving schemes for writing a stripe using four beamlets. The width of one stripe is shown at the right of the drawing. These examples do not show how the beamlets write in real-time, but show which beamlet has written which part of the stripe when the writing has finished.

Example A in FIG. 11 shows stacking the beamlets. Every beamlet writes in its own substripe. For this configuration each beamlet only writes a small number of bits before it flies back. The frequency of the deflection signal is high and its amplitude is low. This writing strategy is suited to the case where the beamlets in a group are arranged so that the group width GW (equal to the number of beamlets N in a sub-beam group multiplied by the projection pitch $P_{proj,X}$) is equal to the stripe width (perpendicular projection). Perpendicular projection is a family of writing strategies. For the basic form of perpendicular projection all beamlets write small substripes, and the width of the substripe is a fraction of the stripe width. The size of the grid of blanker holes is typically related to the stripe width.

In example B, the beamlets are interleaved over the full stripe width. The frequency of the deflection signal is low and its amplitude is large. The writing strategy that fits with the interleaving scan lines is the parallel projection writing strategy. Parallel projection is a family of writing strategies, in which all beamlets write the full stripe width in an interleaved way. Note that the grid of blanker apertures is not necessarily related to the stripe width.

Especially for a relatively low number of beamlets in a group, this strategy allows for a smaller group size and an improved fill ratio. Because of the small number of beamlets, the size of the group on the wafer is significant smaller than the stripe because of a reasonable fill factor. For this write strategy (parallel projection) one can calculate a series of pixel sizes that is realized for a particular number of beamlets in a group and a certain beamlet pitch. The pixel size is not an arbitrary value. Extra bits in the scan line bit frame may be added to compensate for the worst case offset between a beamlet blanker aperture and the center of the stripe.

Example C is a combination of interleaving and stacking. For example D the successive interleaved layers are overlapping like a brick wall. Compared to example C, this configuration will provide better averaging between beamlets. At the stripe boundary there are beamlets that would write over the stripe boundaries.

Figure 12A:
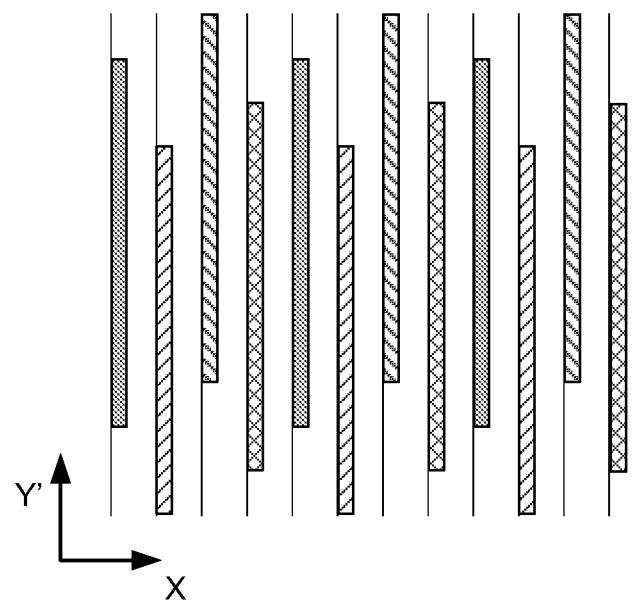
FIG. 12A schematically illustrates a method of exposing a target by means of a plurality of beamlets.
Figure 12B:
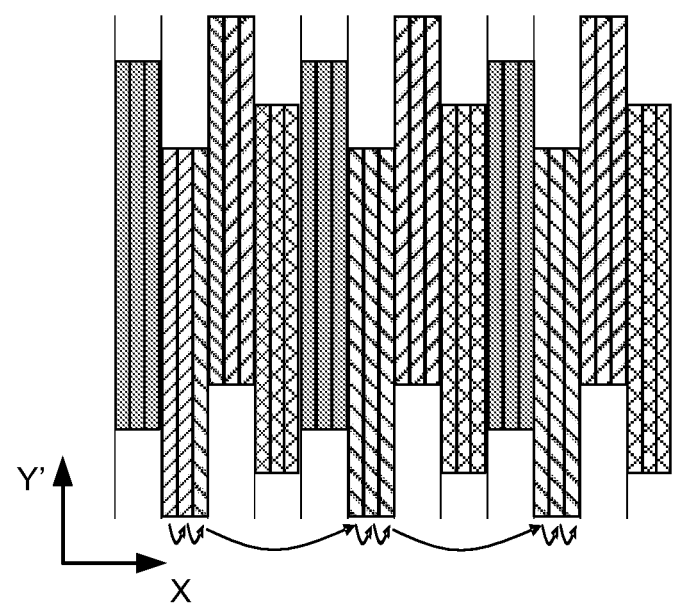
FIG. 12B schematically illustrates a method of exposing a target by means of a plurality of beamlets according to a first embodiment of the invention.

FIGS. 12A and 12B schematically illustrate methods of exposing a target by means of a plurality of beamlets in which the exposure pattern is achieved by deflection of each beamlet over the full scan width to be covered by an individual projection lens system. For example, for a field to be exposed with a width of 26 mm using a system having 13,000 projection lens systems, an arrangement of the projection lens systems will result in a full scan width of 2 microns.

In this example, the target is exposed by using a writing strategy taking into account the projected pitch of the beamlets in the array as projected onto a plane in the X-direction, i.e. $P_{proj,X}$. The distance between adjacent scan lines is equal to the projection pitch in the X-direction.

In FIG. 12A, a part of the exposed area of a target is shown being exposed by four beamlets along vertical scan lines. An area exposed by a first beamlet, e.g. beamlet 40A in FIG. 9, is schematically depicted by the scan lines with a gray pattern. An area exposed by a second beamlet, e.g. beamlet 40B in FIG. 9, is schematically depicted by the scan lines with a first hatched pattern, i.e. hatching sloping down to the left. An area exposed by a third beamlet, e.g. beamlet 40C in FIG. 9, is schematically depicted by the scan lines with a second hatched pattern, i.e. hatching sloping down to the right. An area exposed by a fourth beamlet, e.g. beamlet 40D in FIG. 9, is schematically depicted by the scan lines with a third hatched pattern, i.e. a cross-hatched pattern.

In the example shown in FIG. 12A, the desired grid cell size (i.e. the desired beamlet positioning resolution) is smaller than the projection pitch of the beamlets in the X-direction. It can be readily seen that exposing a target by moving the array of beamlets relative to a target in the X-direction while deflecting the beamlets in a straightforward way in the Y'-direction will not provide full coverage of the target. Hence, in order to provide full coverage a different writing strategy is needed.

In FIG. 12B, the area is fully exposed by using an alternative writing strategy, employing a writing strategy of the parallel type. In this method, the relative movement in the X-direction and the movement of the plurality of beamlets in the Y'-direction are such that the distance between adjacent scan lines exposed by the plurality of beamlets equals $$\frac{P_{proj,X}}{(F_{N-1})}$$

where $F_{N-1} \neq 1$. In this equation, $P_{proj,X}$ is a projection pitch between beamlets of the plurality of beamlets in the array in a direction parallel to the X-direction; and $F_{N-1}$ is a factor of (N−1), where N is the number of beamlets in the array.

In the embodiment schematically depicted in FIG. 12B, four beamlets are used. Hence, the relative movement between the target and the plurality of beamlets is performed such that the distance between adjacent scan lines exposed by the plurality of beamlets equals ⅓ of $P_{proj,X}$. In case the number of beamlets in the array would be 100, e.g. an array of 10×10 beamlets, the distance between adjacent scan lines exposed by the plurality of beamlets according to this method would equal 1/99, 1/33, 1/11, 1/9, or ⅓ of $P_{proj,X}$ for $F_{N-1}$ being 99, 33, 11, 9 and 3 respectively.

Furthermore, in this embodiment the relative movement between the target and the beamlets is performed in a stepwise manner. Movement in the mechanical scan direction is such that the beamlets may expose three scan lines before reaching an area already exposed by another beamlet. This movement is schematically depicted with respect to the second beamlet by means of a small arrows at the bottom of FIG. 12B. After finishing the third scan line, the beamlets are translated over a larger distance, such that the first beamlet is positioned just after the last scan line exposed by the fourth beamlet. This translation is schematically depicted with respect to the second beamlet by means of a large arrow. After the translation, a new sequence of three scan lines is started. The stepwise movement of this writing strategy may be accomplished by a constant deflection pattern of the beamlets and varying the speed of movement of the target in the X-direction, or a varying deflection pattern of the beamlets and steady movement of the target, or a combination of both.

The advantage of the writing strategy used to obtain the exposure as shown in FIG. 12B over the writing strategy used to obtain the exposure as shown in FIG. 12A is that the entire area of the target is covered. However, movement in the mechanical scan direction, i.e. direction of intended mechanical movement of the target is irregular, i.e. requires the deflector 9 of the system to jump over already exposed scan lines in steps of irregular magnitude. Especially with respect to the translation over a large distances, the deflector may require relatively considerable settling time, thereby spending overhead time of the system. Moreover, such system and writing method could be susceptible to positioning errors, hence, necessitating to account for settling times and/or implement positioning control to avoid so-called stitching errors. A disadvantage of the writing strategy is that a certain portion of adjacent scan lines are exposed (scanned) by the same beamlet. As a result, variations in the brightness or strength between individual beamlets may result in undesired variations in the exposure pattern on the target. The averaging effect achieved by the writing strategy of FIG. 8A, in which adjacent scan lines are exposed by all of the beamlets in the array, is thus reduced. This disadvantage may be reduced where the beamlet size is much larger than the width of the adjacent scan lines exposed by the same beamlet.

Figure 13A:
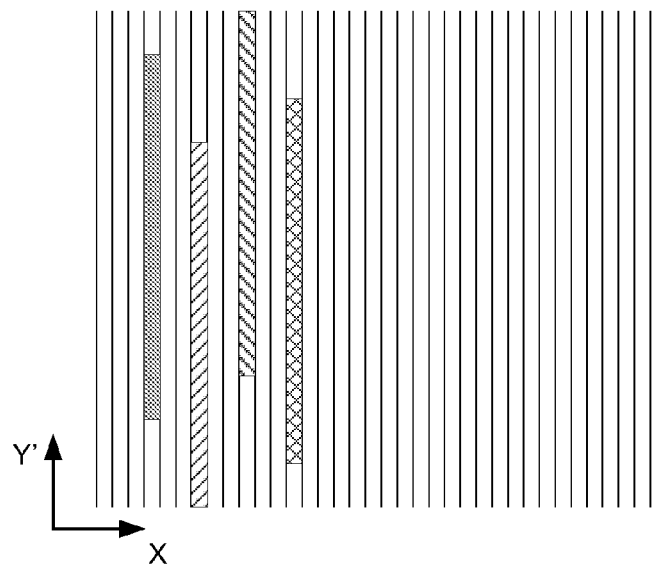
FIGS. 13A-13C schematically illustrate a method of exposing a target by means of a plurality of beamlets according to a second embodiment of the invention.
Figure 13B:
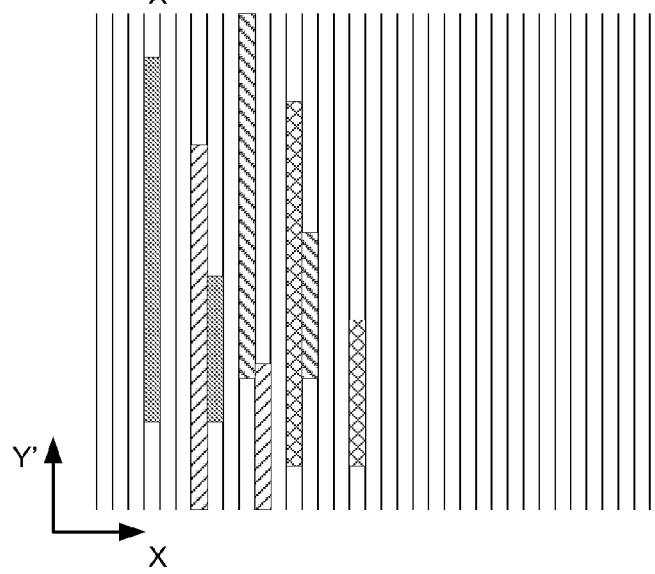
Figure 13C:
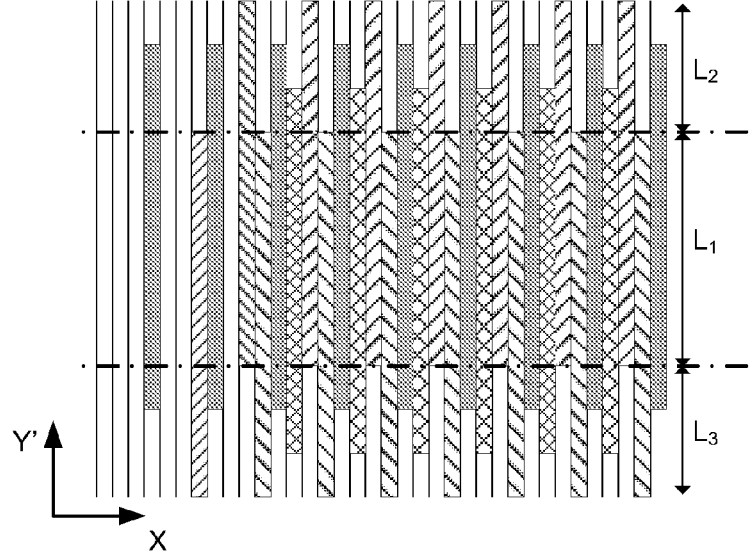
Figure 14:
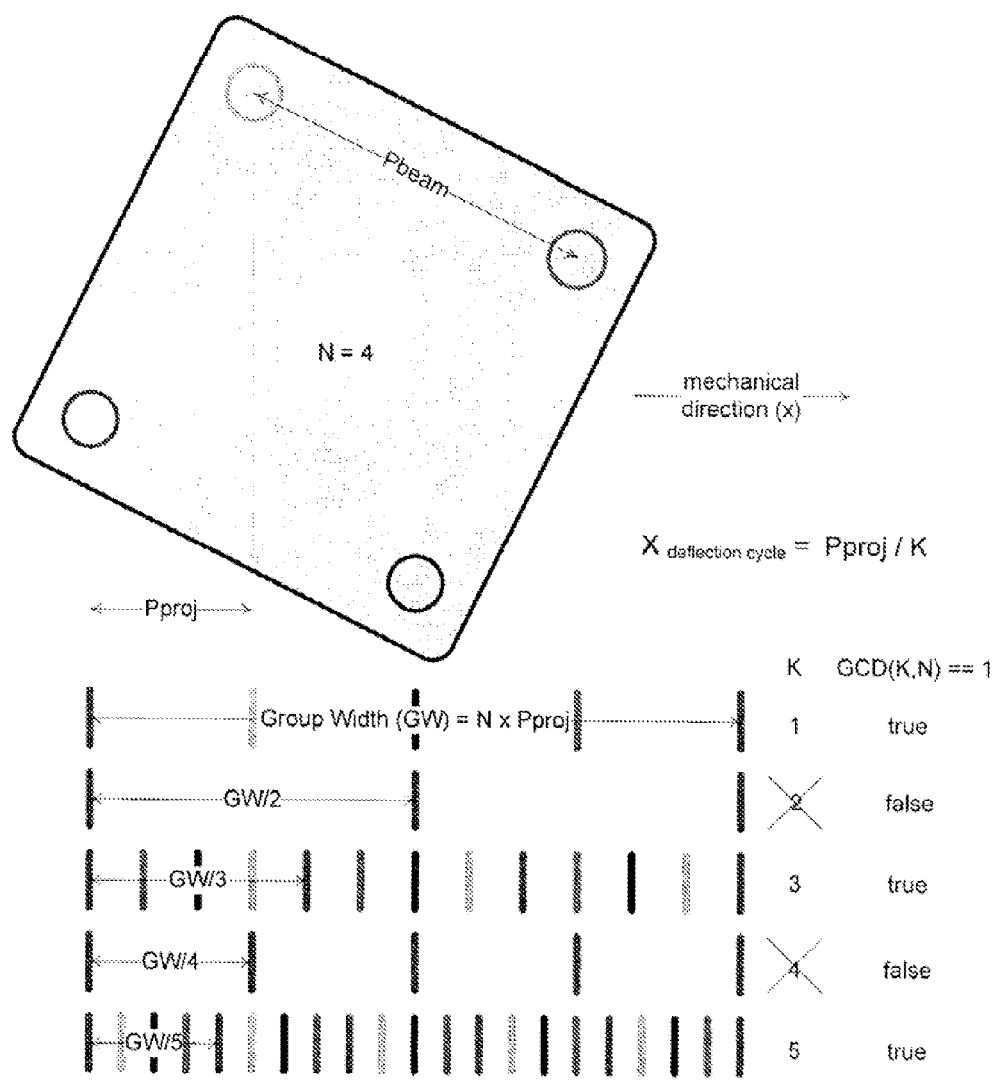
FIG. 14 is a diagram showing beamlet interleaving in a parallel writing strategy.
Figure 15A:
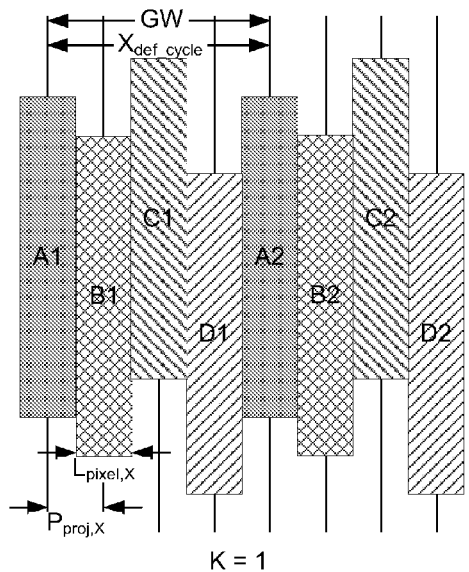
FIG. 15A-15D are diagrams showing various beamlet interleaving schemes in a parallel writing strategy.
Figure 15B:
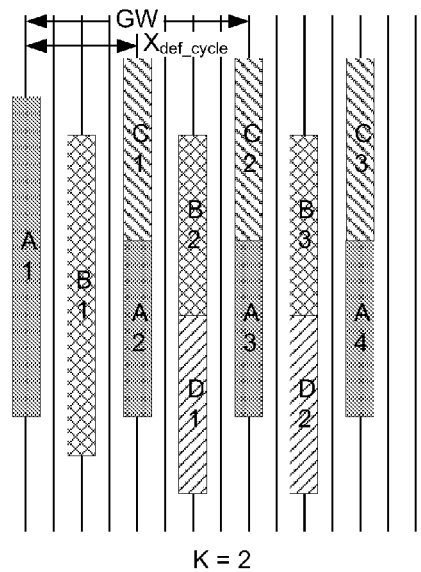
Figure 15C:
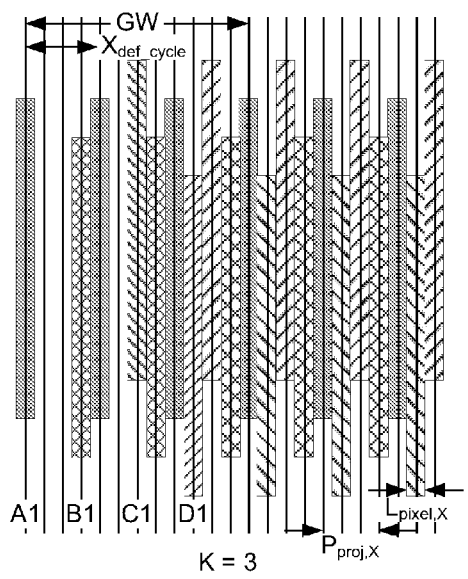
Figure 15D:
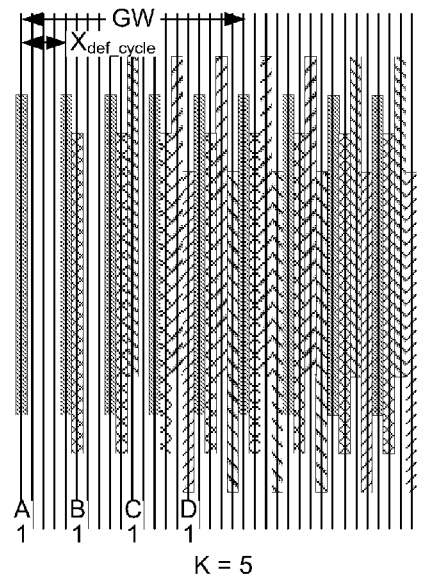

FIGS. 13A-13C schematically illustrate another embodiment of a method of exposing a target. The method enables full exposure of the target without suffering from the disadvantages of the method presented with reference to FIG. 12A, and potential drawbacks of the method presented with reference to FIG. 12B. The method exemplified in FIGS. 13A-13C is a writing strategy of the parallel type.

In this method, the relative movement in the first direction and the movement of the plurality of beamlets in the second direction are coordinated so that the distance between subsequent scan lines exposed by the same beamlet within the plurality of beamlets equals $$\frac{N}{F_{N-1}} P_{proj,X}$$

where $F_{N-1} \ne 1$.

In FIG. 13A, the result of exposure of a first scan line by each beamlet in a 2×2 array of beamlets is schematically shown. In FIG. 13B, exposure of the target has progressed so that each beamlet has exposed a portion of a second scan line. In FIG. 13C, exposure has progressed further such that an area of full coverage of the target is obtained. In this method, instead of having a relative movement of a single scan line width in the X-direction during exposure of a single scan line, the relative movement in the X-direction during exposure of a single scan line equals $$\frac{N}{F_{N-1}} P_{proj,X}$$

where $F_{N-1} \ne 1$.

In FIGS. 13A-13C, four beamlets (in a 2×2 array) have been used to illustrate this method. Hence, the distance between subsequent scanlines exposed by the same beamlet within the plurality of beamlet equals $$\frac{4}{3} P_{proj,X}$$

as is schematically shown in FIGS. 13B and 13C. In case the number of beamlets in the array would be 100, e.g. an 10×10 array of beamlets, the distance between subsequent scan lines exposed by the same beamlet within the plurality of beamlets according to this method would equal $$1\frac{1}{99} P_{proj,X}, 3\frac{1}{33} P_{proj,X}, 9\frac{1}{11} P_{proj,X}, 11\frac{1}{9} P_{proj,X} \text{ or}$$

$$33\frac{1}{3} P_{proj,X}$$

for $F_{N-1}$ being 99, 33, 11, 9 and 3 respectively.

The method as used in FIGS. 13A-13C provides full coverage of the target to be exposed along the X-direction for a width equal to $L_1$, i.e. between the dashed-dotted lines in FIG. 13C. The areas outside of the area $L_1$ may be exposed by one or more other projection lens systems of a multi-beamlet system, e.g. the charged particle multi-beamlet system schematically depicted in FIG. 4 or FIG. 5. As can be seen in FIG. 13C, a portion of each scan line falls outside the area of full coverage, labeled $L_2$ and $L_3$. During the time beamlets are deflected outside the full coverage area, they are typically not used (i.e. blanked or blocked), resulting in less efficient utilization of the multi-beamlet system. This effect is lessened when the full coverage length $L_1$ is much larger than the "end area" lengths $L_2$ and $L_3$.

The writing strategy of FIG. 13C avoids the stepwise movement of the previous writing strategy. Adjacent scan lines are exposed by different beamlets, providing the advantage of averaging out variations between beamlets when the beamlet size is greater than the scan line width. In the example shown, all four beamlets are scanned over four adjacent scan lines, resulting in a 4× averaging effect.

As mentioned earlier, the pattern data for the pattern to be exposed on the target is typically rasterized with respect to a virtual grid. In order to expose the pattern on the target, each beamlet needs to be switched on and off or otherwise modulated in such a way that the sequence of scan lines exposed by the plurality of beamlets form the desired pattern on the target.

With respect to the aforementioned methods, a pattern to be exposed by a single projection lens system of a multi-beam system is divided into scan lines over the full width of $L_1$. The scan lines are then assigned to beamlets. Thus, in dependence of the writing strategy used, different scan lines may be assigned to different beamlets.

FIG. 16 shows a table of pixel size and grid width in dependence on the number of beamlets per patterned beam N, the array tilt angle α, the projection pitch $P_{proj,X}$, and K factor. A large pixel size is desired in order to reduce the amount of control data needed to be generated and transmitted to the lithography machine and to increase throughput of the machine. However, the size of the pixels are limited by the desired CD and the resist properties. In FIG. 16, an optimum pixel size $L_{pixX}$ of 3.5 nm in the X-direction is assumed, and the fourth column from the left shows calculated values of K based on the projection pitch and optimum pixel size (i.e. projection pitch $P_{proj,X}$ divided by pixel size $L_{pixX}$ of 3.5 nm). The closest value of K which is acceptable given the number of beamlets per patterned beam (as explained above), is shown in the fifth column from the left. The sixth and seventh columns show the pixel size $L_{pixX}$ and grid width $W_{proj}$ in nanometers that will result for each combination of number of beamlets per patterned beam, array tilt angle, projection pitch, and K factor.

A higher K indicates a faster beamlet deflection scan speed (relative to stage movement), and results in a smaller pixel in the X-direction. If the beamlet control switching signal is supplied to the beamlet blanker array at a constant data rate, the pixel will become bigger in the Y-direction with a relative increase in beamlet deflection scan speed, so that the pixel shape will reduce in the X-direction and enlarge in the Y-direction, changing from approximating a square into a rectangle. The pixels can assume an arbitrary size in the Y-direction by varying the beamlet deflection scan speed, but can only assume particular sizes in the X-direction due to the interleaving of the beamlets as discussed above.

In a preferred embodiment of the lithography machine, the machine is simplified by omitting facilities for adjusting individual beamlets. The charged particle dose imparted to the wafer can be lowered by increasing the beamlet deflection scan speed. This lowers the dose even though the beamlet current is unchanged. As a consequence, the pixels will become elongated in the Y-direction. Similarly, the dose can be increased by reducing the beamlet deflection scan speed.

Figure 17A:
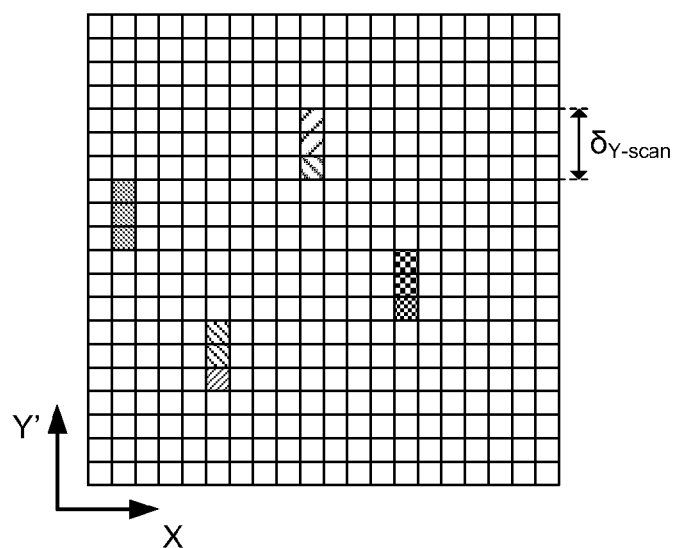
FIGS. 17A-17C schematically illustrate a method of exposing a target by means of a plurality of beamlets according to a third embodiment of the invention.
Figure 17B:
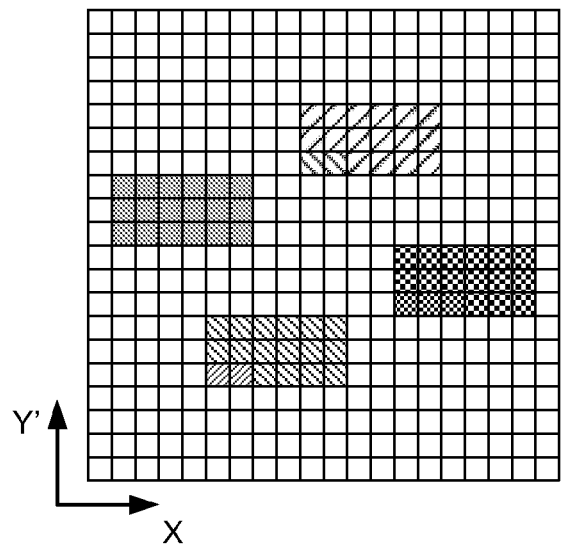
Figure 17C:
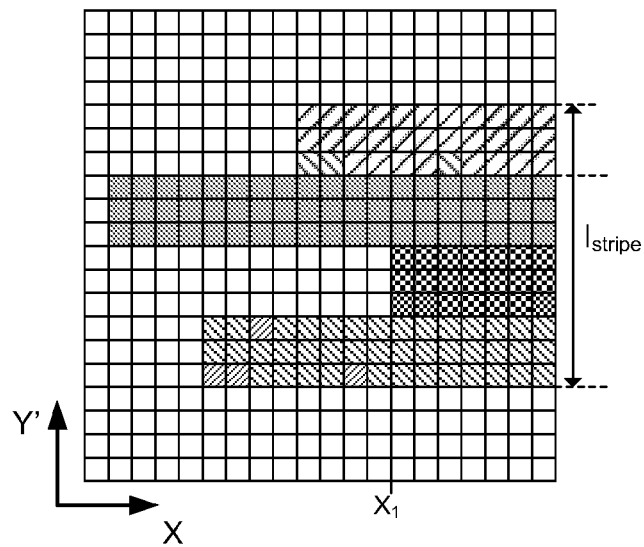

FIGS. 17A-17C schematically show yet another embodiment of a method of exposing a target by means of a plurality of beamlets. This method qualifies as a writing strategy of the perpendicular type. In this method, the target is exposed by a group of beamlets in an array by relative movement in the X-direction, while deflecting the group of beamlets in the Y'-direction, such that each beamlet exposes the target along a deflection scan length $\delta_{Y\text{-}scan}$ in the Y'-direction. The projection pitch $P_{proj,Y}$ in the Y'-direction between beamlets is equal to or smaller than the deflection scan length $\delta_{Y\text{-}scan}$ of each beamlet in the group of beamlets.

In FIG. 17A the first scan line with deflection scan length $\delta_{Y\text{-}scan}$ is schematically depicted. In FIG. 17B, exposure of the target has progressed so that each beamlet has exposed six scan lines. In FIG. 17C, exposure has progressed further such that full coverage of an area with length $I_{stripe}$ is obtained beginning from position $X_1$. As can be readily seen, all of the beamlets will be fully utilized to expose the target within the length $I_{stripe}$. For exposure of a certain length in the Y'-direction, for example $L_1$ in FIGS. 13C and $I_{stripe}$ in FIG. 17C, the deflection length per beamlet is shorter for the method of FIG. 17C than for the method of FIG. 12A, 12B or 13A-13C. Furthermore, the beamlet deflection length $\delta_{Y\text{-}scan}$ is preferably controlled to avoid stitching errors and the like.

The writing strategy of FIG. 17C avoids the "end areas" of partial coverage $L_2$ and $L_3$ shown in FIG. 13C, and thus increases efficiency of the multi-beamlet system. However, the writing strategy of FIG. 17C does not achieve the same beamlet averaging effect.

As mentioned earlier, pattern data is generally rasterized with respect to a virtual grid. In order to expose the desired pattern on the target, each beamlet needs to be switched on and off or otherwise modulated in such a way that the sequence of scan lines exposed by the plurality of beamlets form the desired pattern on the target.

With respect to the method described with reference to FIGS. 17A-17C, a pattern to be exposed by a single projection lens system of a multi-beam system, e.g. the charged particle multi-beam systems schematically depicted in FIGS. 4 and 5, is divided into blocks with a length of $\delta_{Y\text{-}scan}$. Within each block, the data may be divided into scan lines. Each block is then assigned to beamlets.

Figure 18:
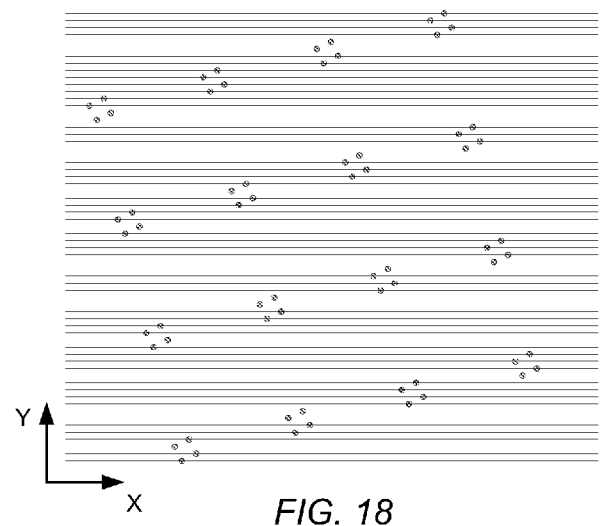
FIG. 18 schematically shows the effect of a specific orientation of a projection lens array and a beamlet array with respect to each other.

FIG. 18 is a schematic representation illustrating the effect of a specific orientation of a projection lens array and a beamlet array with respect to each other, i.e. the orientation of plurality of groups of beamlets, and the orientation of the beamlets within each individual group of beamlets. The configuration shown, in fact represents part of an aperture array element of a system according to the invention provided with groups of four apertures, realizing a corresponding number of projections through a single lens system. In the set-up as represented, each group of apertures comprises four beamlets, and the smallest distance between groups, i.e. between apertures of groups is larger than the pitch of the apertures within a group. In this set-up 4×4 groups of apertures have been used, each group for passing beamlets through towards 4×4 projection lenses.

The orientation of the beamlets and the projection lenses is such that, during relative movement of the projection lens array and plurality of beamlets with respect to the target in the mechanical scan direction, the entire surface area of the target can be exposed by deflection of the beamlets in a deflection scan direction, generally substantially perpendicular to the mechanical scan direction.

In FIG. 18, the orientation of the projection lens array with respect to the mechanical direction of movement is different from the orientation of the beamlet array. The X-direction indicated here is indicative for the movement of a target carrier, while the Y-direction, perpendicular thereto, represents an effective direction of scanning of beamlets over a target as caused by deflection action of deflector 9.

Figure 19:
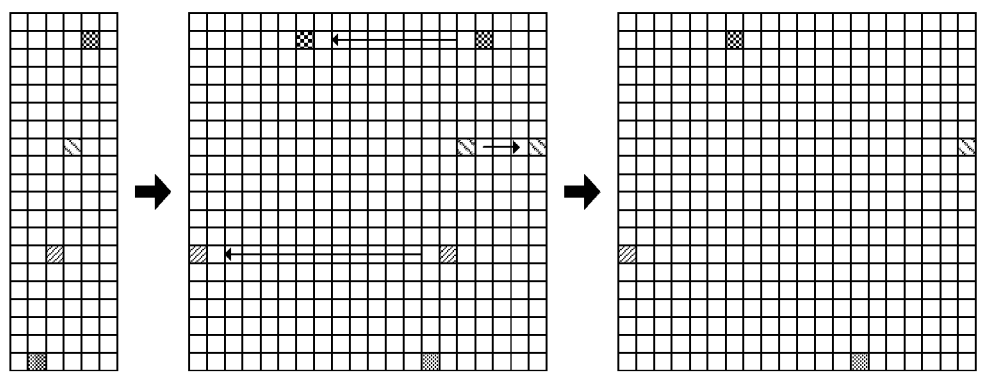
FIG. 19 schematically illustrates a scheme how to construct a two-dimensional array that uses a method of exposing a target by means of a plurality of beamlets according to a fourth embodiment of the invention.

FIG. 19 schematically illustrates a scheme to determine the placement of beamlets in a two-dimensional array for use in the method of exposing a target of FIG. 13. In this method, the concept of a diagonal line is used to expose the surface area of the target with an exposure pattern. With this concept, the relative movement in the first direction (e.g. the direction of mechanical movement) and the movement of the plurality of beamlets in the second direction (e.g. the deflection scan direction) are such that the beamlets in the array scan adjacent scan lines in a diagonal pattern. In theory, the group of beamlets could be arranged in an array formed as a diagonal line to perform this writing strategy. In practice, the size of the projections lens systems may be much larger than the desired distance between adjacent scan lines (i.e. the grid cell size) so that arrangement of the beamlets along a diagonal line is not possible.

In FIG. 19, it is schematically shown that such a writing strategy will not only work for a diagonal line, but can also be applied when using a suitable two-dimensional array of beamlets. Starting from a diagonal line (left diagram in FIG. 19) of 4 beamlets, rearrangement of the beamlets along the mechanical scan direction (shown in the middle diagram in FIG. 19) leads to a suitable 2×2 array of beamlets (right diagram in FIG. 19).

The diagonal line is aligned such that the beamlets are at a projection pitch $P_{proj,Y}$ in the Y'-direction, and are separated by one scan line interval in the X-direction (one scan line interval being the distance between adjacent scan lines exposed on the target. The 2×2 array of beamlets is then constructed by rearranging the beamlets. Each beamlet in the array is positioned at the same projection pitch $P_{proj,Y}$ in the Y'-direction as the beamlets in the diagonal line. However, in a direction parallel to the X-direction, each beamlet is displaced from the diagonal line by a whole number of beamlet intervals (one beamlet interval being the distance between subsequent scan lines exposed by the same beamlet). The placement of the beamlets in the array in the X-direction is selected so that the in resulting array, each beamlet is approximately equidistant from at least two other beamlets. The resulting beamlet array is preferably as close as possible to a square, hexagonal, or triangular array.

Figure 20A:
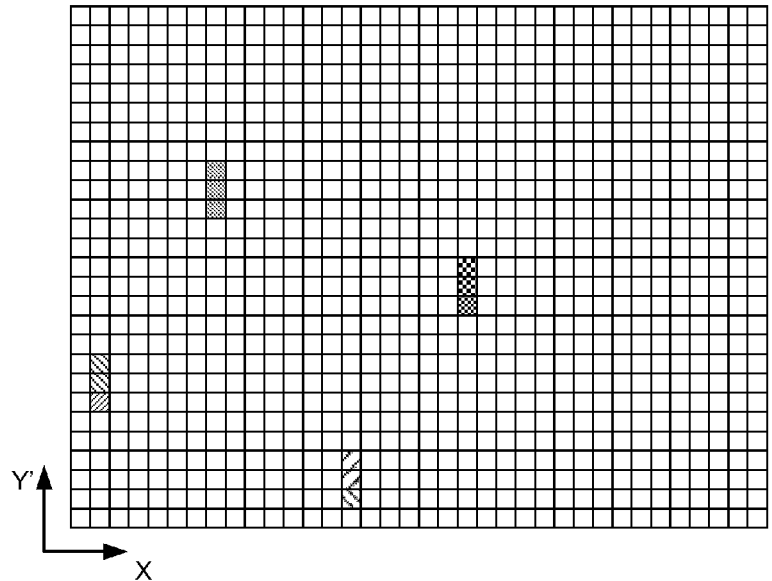
FIGS. 20A-20D schematically illustrate a method of exposing a target by means of a plurality of beamlets according to a fourth embodiment of the invention.
Figure 20B:
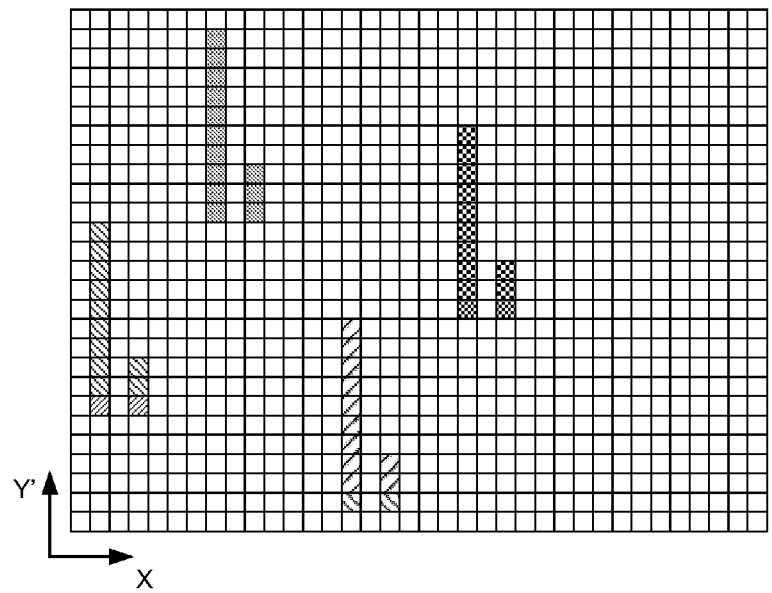
Figure 20C:
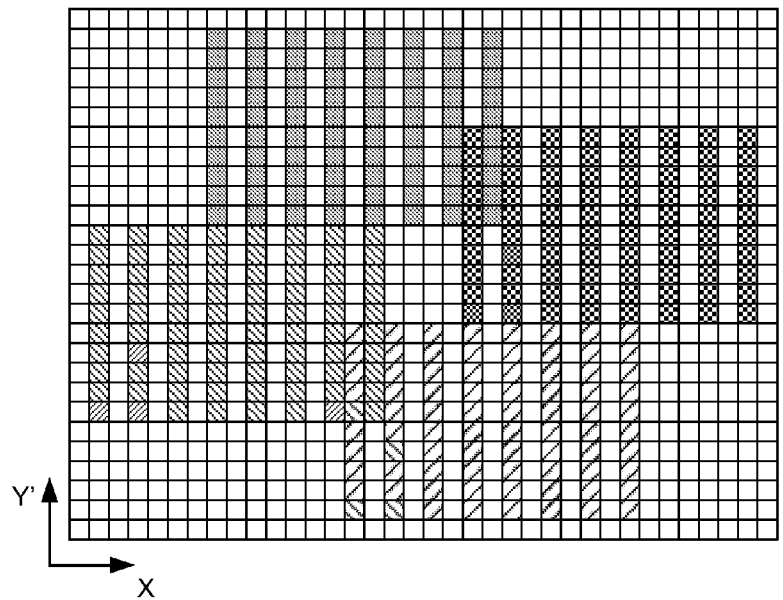
Figure 20D:
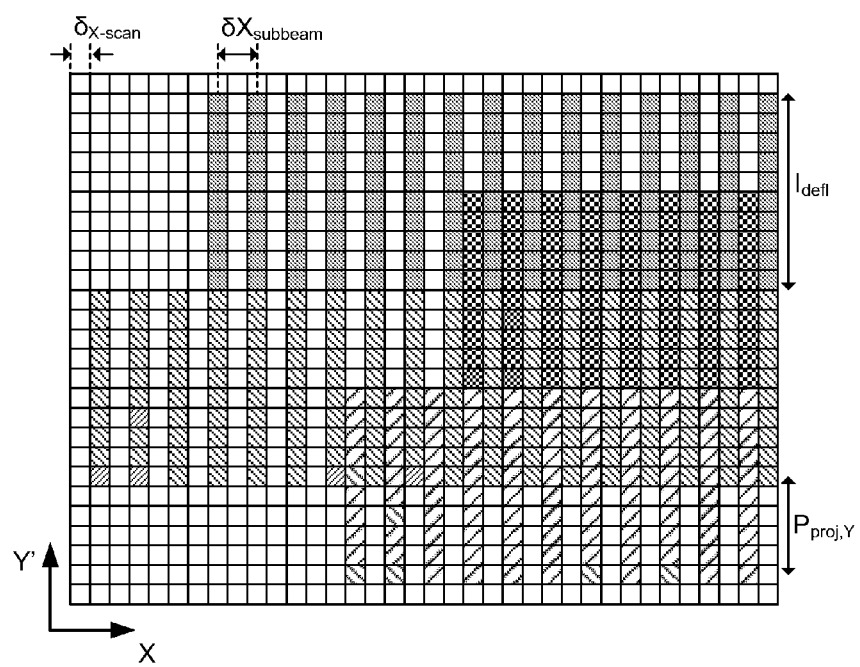

FIGS. 20A-20D schematically illustrate the method of exposing a target by means of a plurality of beamlets using a two-dimensional 2×2 array constructed as shown in FIG. 19. In FIG. 20A, the result of exposure of a portion of a first scan line by each beamlet in a 2×2 array of beamlets is schematically shown. In FIG. 20B, exposure of the target has progressed so that each beamlet has exposed a portion of a second scan line, and in FIG. 20C nine scan lines have been exposed by each beamlet. In FIG. 20D, exposure has progressed further such that an area of full coverage of the target is obtained, shown on the right-hand side of the drawing. From FIGS. 20A-20D it can be seen that the diagonal line writing strategy is applicable. As can be seen in FIG. 20D, in the area of full coverage, the beamlets in the array scan adjacent scan lines in a diagonal pattern.

Furthermore, the following may be noticed with respect to this writing strategy. It can be seen that at least some of the scan lines are scanned by more than one beamlet of the array, so that in the example shown, some of the scan lines are scanned over a first portion of the scan line distance by a first beamlet of the array and over a second portion of the scan line distance by a second beamlet of the array.

In the example shown, the beamlets are arranged in an array of 2 rows and 2 columns, and the relative movement in the X-direction and movement of the beamlets in the Y'-direction is such that each beamlet in the array scans every second scan line. Furthermore, a portion of the scan lines is scanned by two beamlets, as can be seen on the right-hand side of FIG. 13D where all four beamlets have exposed the target to provide full coverage of the target. If the array of beamlets comprises R rows and C columns of beamlets, the relation between the movements in the X- and Y'-directions is then such that each beamlet in the array exposes every $R^{th}$ scan line, and that a portion of the scan lines (i.e. in the area where total coverage of the target is achieved) are scanned by C beamlets. Furthermore, if all beamlets of the array are scanned on M adjacent scan lines, each beamlet of the array is scanned on each $M^{th}$ scan line. This can be seen in the example in FIG. 20D, where all four beamlets are scanned on two adjacent scan lines in the area where total coverage of the target is achieved, and each beamlet of the array is scanned on every second scan line.

The writing strategy of FIG. 20D has several advantages. When compared to the writing strategy of FIG. 13C, the "end areas" of partial coverage have been reduced. The length of these end areas is equal to the projection pitch between two beamlets in the Y'-direction $P_{proj,Y}$, instead of the projection pitch of the entire array of beamlet as in FIG. 13C. In addition the writing strategy of FIG. 20D achieves averaging of beamlets. In the example shown in FIG. 20D, there is a 2× averaging in the area of full coverage (i.e. two beamlets are used to alternately expose adjacent scan lines). The same writing strategy can be used with a different size array of beamlets to achieve 3× averaging, 4× averaging or more.

In embodiments of aforementioned methods, i.e. the methods described with reference to FIGS. 12B and 13A-13C, $P_{proj,X}$ may be equal to or smaller than a beamlet spot size as projected on the target. Alternatively, the beamlet spot size as projected on the target may be larger than the distance between adjacent scan lines exposed by the plurality of beamlets. The array forming the plurality of beamlets may comprise a number of rows and a number of columns, at least one of the rows and columns being positioned at an angle unequal to 90° with respect to the mechanical scan direction and the deflection scan direction. Alternatively, or additionally, the array forming the plurality of beamlets may be positioned at an angle with respect to the first direction such that the projection pitch between each pair of beamlets in the array in a direction parallel to the first direction is equal. The number of rows may be equal to the number of columns.

In embodiments of the invention, the beamlets are charged particle beamlets, preferably electron beamlets.

A control unit, e.g. control unit 18, may be arranged to coordinate the relative movement between the target and the plurality of beamlets to enable execution embodiments of aforementioned methods.

It should be understood that the control unit, e.g. control unit 18, may be implemented in the form of a computer assembly comprising a processor, and a memory connected to the processor. The memory may comprise memory elements, e.g. a hard disk, Random Access Memory (RAM), Read Only Memory (ROM) Electrically Erasable Programmable Read Only Memory (EEPROM), etc. The processor may be connected to a reading unit, which is arranged to read data from a computer readable medium. The computer readable medium may be arranged to performing, when executed by the processor, embodiments of aforementioned methods of exposing a target by means of a plurality of beamlets in a charged particle multi-beamlet system.

Additional aspects of the present invention relate to writing strategies of a perpendicular type. In an embodiment, a method of exposing a target by means of a plurality of beamlets comprises: providing a plurality of beamlets, the beamlets being arranged in an array; converging groups of beamlets towards a common point of convergence for each group providing a target to be exposed; creating relative movement in a first direction between the plurality of beamlets and the target; deflecting each group of beamlets in a second direction substantially perpendicular to the first direction, such that each beamlet within a group of beamlets exposes the target along a deflection scan length in the second direction; wherein a projection pitch $P_{proj,Y}$ in the second direction between beamlets within a group of beamlets in the array is equal or smaller than the deflection scan length of each beamlet within the group of beamlets.

The method may include one or more of the following further features. The projection pitch $P_{proj,Y}$ may be equal to or smaller than a beamlet spot size as projected on the target. The array of beamlets may comprise a number of rows and a number of columns, at least one of the rows and columns being positioned at an angle unequal to 90° with respect to the first direction and the second direction. A plurality of arrays of beamlets may be provided.

The first direction may be substantially perpendicular to the second direction. The array of beamlets form a single patterned beamlet, the single patterned beamlet being patterned in accordance with a rasterized grid with grid cells having a predetermined dimension.

In a further aspect, the present invention may encompass a computer readable medium for performing, when executed by a processor, an embodiment of the method of exposing a target by means of a plurality of beamlets in a charged particle multi-beamlet system of the perpendicular type as described above.

The invention also encompasses a charged particle multi-beamlet system for patterning a target using a plurality of beamlets, the system comprising: a beamlet pattern generator for providing a radiation pattern formed by a plurality of beamlets, the plurality of beamlets being arranged in groups of beamlets; an array of projection lens systems for projecting the groups of beamlets on to the surface of the target, each project lens system corresponding with a group of beamlets; a deflector array for deflecting a group of beamlets in a second direction substantially perpendicular to the first direction, such that each beamlet within a group of beamlets exposes the target along a modulation scan width in the second direction, the deflector array comprising a plurality of deflectors, each deflector arranged to deflect a corresponding group of beamlets; and a substrate support member for supporting the target to be exposed; wherein a projection pitch $P_{proj,Y}$ in the second direction between beamlets within a group of beamlets in the array is equal or smaller than the deflection scan width of each beamlet within the group of beamlets; wherein a projection pitch $P_{proj,Y}$ in the second direction between beamlets within a group of beamlets in the array is equal or smaller than the deflection scan width of each beamlet within the group of beamlets.

The charged particle multi-beamlet system may include one or more of the following further features. The projection pitch $P_{proj,Y}$ may be equal to or smaller than a beamlet spot size as projected on the target. The beamlet pattern generator may comprise: at least one charged particle source for generating a charged particle beam; an aperture array defining separate beamlets or sub-beams from the generated beam; a beamlet manipulator for converging groups of beamlets towards a common point of convergence for each group; and a beamlet blanker for controllably blanking beamlets in the groups of beamlets. The common point of convergence for each group of beamlets may be a point corresponding to one of the projection lens systems. The array of beamlets may comprise a number of rows and a number of columns, at least one of the rows and columns being positioned at an angle unequal to 90° with respect to the first direction and the second direction. The plurality of beamlets may be arranged in a plurality of arrays. The first direction may be substantially perpendicular to the second direction. The plurality of beamlets may form a single patterned beamlet, the single patterned beamlet being patterned in accordance with a rasterized grid with grid cells having a predetermined dimension.

Additional aspects of the present invention relate to writing strategies of a diagonal line type. In an embodiment, a method of exposing a target by means of a plurality of beamlets comprises: providing a plurality of beamlets, the beamlets being arranged in an array of N beamlets; providing a target to be exposed; creating relative movement in a first direction between the plurality of beamlets and the target; moving the plurality of beamlets in a second direction such that the beamlets expose a plurality of scan lines on the target; wherein the relative movement in the first direction and the movement of the plurality of beamlets in the second direction are such that the beamlets in the array expose adjacent scan lines in a diagonal pattern.

The method may include one or more of the following further features. Each scan line may be scanned in the second direction over a scan line distance, and at least some of the scan lines are scanned by more than one beamlet of the array. At least some of the scan lines may be scanned over a first portion of the scan line distance by a first beamlet of the array and over a second portion of the scan line distance by a second beamlet of the array. All N beamlets of the array may be scanned on M adjacent scan lines, each beamlet of the array being scanned on each Mth scan line.

In another embodiment of a writing strategy of a diagonal line type, a method of exposing a target by means of a plurality of beamlets comprises: providing a plurality of beamlets, the beamlets being arranged in an array of R rows and C columns of beamlets; providing a target to be exposed; creating relative movement in a first direction between the plurality of beamlets and the target; moving the plurality of beamlets in a second direction such that the beamlets expose a plurality of scan lines on the target; wherein the relative movement in the first direction and the movement of the plurality of beamlets in the second direction are such that each beamlet in the array scans every Rth scan line, and a portion of the scan lines are scanned by C beamlets.

The method may include one or more of the following further features. The plurality of beamlets may be moved in the second direction over a distance of at least approximately R times the projection pitch $P_{proj,Y}$ in the second direction between beamlets in the array. Each scan line may be scanned in the second direction over a scan line distance, and each beamlet in the array scans a portion of the scan line approximately equal to 1/C of the scan line distance. Each scan line may be scanned by C beamlets of the array of beamlets.

In yet another embodiment of a writing strategy of a diagonal line type, a method of exposing a target by means of a plurality of beamlets comprises: providing a plurality of beamlets, the beamlets being arranged in an array; providing a target to be exposed; creating relative movement in a first direction between the plurality of beamlets and the target; and moving the plurality of beamlets in a second direction such that the beamlets expose a plurality of scan lines on the target, adjacent scan lines being separated by a scan line interval and subsequent scan lines exposed by the same beamlet being separated by a beamlet interval; wherein each beamlet in the array is positioned a whole number of beamlet intervals in a direction parallel to the first direction from a diagonal, and at a projection pitch $P_{proj,Y}$ in the second direction, so that each beamlet is approximately equidistant from at least two other beamlets, the diagonal being aligned with points separated by one scan line interval in the first direction and by the projection pitch $P_{proj,Y}$ in the second direction.

The embodiments of a writing strategy of the diagonal line type as described above may include one or more of the following features. A projection pitch $P_{proj,X}$ in the first direction between beamlets of the array may be equal to or smaller than a beamlet spot size as projected on the target. The array of beamlets may comprise a number of rows and a number of columns, at least one of the rows and columns being positioned at an angle unequal to 90° with respect to the first direction and the second direction. A plurality of arrays of beamlets may be provided. The first direction may be substantially perpendicular to the second direction. The array of beamlets may form a single patterned beamlet, the single patterned beamlet being patterned in accordance with a rasterized grid with grid cells having a predetermined dimension.

In a further aspect, the present invention may encompass a computer readable medium for performing, when executed by a processor, an embodiment of the method of exposing a target by means of a plurality of beamlets in a charged particle multi-beamlet system of the diagonal line type as described above.

The invention also encompasses a charged particle multi-beamlet system for patterning a target using a plurality of beamlets. The charged particle multi-beamlet system comprises: a beamlet pattern generator for providing a radiation pattern formed by a plurality of beamlets, the plurality of beamlets being arranged in an array of N beamlets; an array of projection lens systems for projecting the plurality of beamlets on to the surface of the target, each project lens system corresponding with a group of beamlets; a deflector array for deflecting a group of beamlets in a second direction substantially perpendicular to the first direction, such that each beamlet within a group of beamlets exposes the target along a modulation scan width in the second direction, the deflector array comprising a plurality of deflectors, each deflector arranged to deflect a corresponding group of beamlets; a substrate support member for supporting the target to be exposed; and a control unit arranged to coordinate relative movement between the substrate support member and the plurality of beamlets in a first direction and movement of the group of beamlets in the second direction such that the beamlets in the array scan adjacent scan lines in a diagonal pattern.

The charged particle multi-beamlet system may include one or more of the following further features. The control unit may be further arranged to control scanning in the second direction over a scan line distance, and control that at least some of the scan lines are scanned by more than one beamlet of the array. The control unit may be further arranged to control that at least some of the scan lines are scanned over a first portion of the scanline distance by a first beamlet of the array and over a second portion of the scanline distance by a second beamlet of the array. All N beamlets of the array may be scanned on M adjacent scan lines, each beamlet of the array being scanned on each Mth scan line.

In another embodiment, a charged particle multi-beamlet system for patterning a target using a plurality of beamlets comprises: a beamlet pattern generator for providing a radiation pattern formed by a plurality of beamlets, the plurality of beamlets being arranged in groups of beamlets, the group of beamlets being arranged in an array of R rows and C columns of beamlets; an array of projection lens systems for projecting the groups of beamlets on to the surface of the target, each project lens system corresponding with a group of beamlets; a deflector array for deflecting a group of beamlets in a second direction substantially perpendicular to the first direction, such that each beamlet within a group of beamlets exposes the target along a modulation scan width in the second direction, the deflector array comprising a plurality of deflectors, each deflector arranged to deflect a corresponding group of beamlets; a substrate support member for supporting the target to be exposed; and a control unit arranged to coordinate relative movement between the substrate support member and the plurality of beamlets in a first direction and movement of the group of beamlets in the second direction such that each beamlet in the array scans every Rth scan line, and a portion of the scan lines are scanned by C beamlets.

The charged particle multi-beamlet system may include one or more of the following further features. The control unit may be further arranged to move the plurality of beamlets in the second direction over a distance of at least approximately R times the projection pitch $P_{proj,Y}$ in the second direction between beamlets in the array. The control unit may be further arranged to coordinate the relative movement between the substrate support member and the plurality of beamlets in the first direction and the movement of the group of beamlets in the second direction such that each scan line is scanned in the second direction over a scan line distance, and each beamlet in the array scans a portion of the scan line approximately equal to 1/C of the scan line distance. Each scan line may be scanned by C beamlets of the array of beamlets.

In yet another embodiment, a charged particle multi-beamlet system for patterning a target using a plurality of beamlets comprises: a charged particle source for generating a charged particle beam; a beamlet aperture array for defining groups of beamlets from the generated beam; a deflector array for deflecting a group of beamlets in a second direction, the deflector array comprising a plurality of deflectors, each deflector arranged to deflect a corresponding group of beamlets; an array of projection lens systems for projecting the groups of beamlets on to the surface of the target, each project lens system corresponding with a group of beamlets; a substrate support for supporting the target to be exposed; and a control unit arranged to coordinate relative movement between the substrate support and the plurality of beamlets in a first direction and movement of the group of beamlets in the second direction such that the beamlets expose a plurality of scan lines on the target, adjacent scan lines being separated by a scan line interval and subsequent scan lines exposed by the same beamlet being separated by a beamlet interval; wherein each group of beamlets projected onto the target is arranged in an array, each beamlet in the array being positioned a whole number of beamlet intervals in a direction parallel to the first direction from a diagonal, and at a projection pitch $P_{proj,Y}$ in the second direction, so that each beamlet is approximately equidistant from at least two other beamlets, the diagonal being aligned with points separated by one scan line interval in the first direction and by the projection pitch $P_{proj,Y}$ in the second direction.

The embodiments of a charged particle multi-beamlet system as described above may include one or more of the following features. The projection pitch $P_{proj,X}$ may be equal to or smaller than a beamlet spot size as projected on the target. The beamlet pattern generator may comprise: at least one charged particle source for generating a charged particle beam; an aperture array defining separate beamlets or sub-beams from the generated beam; a beamlet manipulator for converging groups of beamlets towards a common point of convergence for each group; and a beamlet blanker for controllably blanking beamlets in the groups of beamlets. The common point of convergence for each group of beamlets may be a point corresponding to one of the projection lens systems. The array of beamlets may comprise a number of rows and a number of columns, at least one of the rows and columns being positioned at an angle unequal to 90° with respect to the first direction and the second direction. The plurality of beamlets are arranged in a plurality of arrays. The first direction may be substantially perpendicular to the second direction. The plurality of beamlets may form a single patterned beamlet, the single patterned beamlet being patterned in accordance with a rasterized grid with grid cells having a predetermined dimension.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A method of exposing a field on a target by means of a plurality of charged particle beamlets, the method comprising:
   providing a target to be exposed, the target comprising the field;
   generating a plurality of charged particle beamlets, the beamlets being generated by one or more aperture arrays having apertures arranged in a plurality of groups, each group generating a plurality of the beamlets;
   blanking selected ones of the plurality of beamlets to define positions of exposing or not exposing the target by respective beamlets;
   creating relative movement in a first direction between the plurality of beamlets and the target;
   deflecting the groups of beamlets in a second direction simultaneously with the relative movement in the first direction such that each unblanked beamlet exposes a plurality of parallel scan lines on the target;
   wherein the relative movement in the first direction, the deflection of the plurality of beamlets in the second direction, and the arrangement of the apertures in the one or more apertures arrays, are such that the distance between adjacent parallel scan lines exposed by the unblanked beamlets of each group of beamlets is smaller than a pitch between beamlets from adjacent apertures of the aperture array which generated the group of beamlets.

2. The method of claim 1, wherein the field on the target is divided into a plurality of stripes, and wherein at least a portion of beamlets in one of the groups of beamlets exposes a portion of a first stripe of the field and a portion of beamlets in the same group of beamlets also exposes a portion of a second stripe of the field adjacent to the first stripe.

3. The method of claim 1, wherein the scan lines of the beamlets each comprise a pattern section within a first stripe and an overscan section within an adjoining stripe.

4. The method of claim 1, wherein the relative movement in the first direction between the plurality of beamlets and the target is generated by moving the target in the first direction.

5. The method of claim 1, wherein at least one of the aperture arrays for generating the charged particle beamlets comprises apertures arranged in rows, each aperture in a row being offset with respect to an adjacent aperture, the offset being in a direction perpendicular to the first direction.

6. The method of claim 5, wherein the offset between adjacent apertures in the row of the at least one aperture array, the relative movement in the first direction, and the deflection of the plurality of beamlets in the second direction result in the distance between adjacent parallel scan lines exposed by the beamlets being smaller than a pitch between adjacent apertures of the aperture array.

7. The method of claim 1, wherein the distance between subsequent scan lines exposed by the same beamlet within the array of beamlets is smaller than the projected size of the array in the first direction.

8. The method of claim 1, wherein the method further comprises defining positions of exposing or not exposing the target by respective beamlets, the exposure or non-exposure in dependence of a blanking or a non blanking of each individual beamlet.

9. The method of claim 8, wherein the positions of exposing or not exposing the target comprise a virtual grid having a first axis oriented in line with the first direction of movement, and a second axis being oriented transverse thereto.

10. The method of claim 1, wherein a projection pitch $P_{proj,X}$ in the first direction between the scan lines is equal to or smaller than a beamlet spot size as projected on the target.

11. The method of claim 1, wherein scan lines of one or more beamlets from a second scan are interleaved with scan lines of one or more beamlets from a first scan.

12. A charged particle multi-beamlet system for exposing a field on a target using a plurality of charged particle beamlets, the system comprising:
   one or more aperture arrays for generating the plurality of charged particle beamlets, the apertures arranged in a plurality of groups, each group of apertures generating a plurality of the beamlets;
   a moveable substrate support member for supporting the target to be exposed and moving the substrate in a first direction;
   a deflector array for deflecting the groups of beamlets in a second direction, the deflector array comprising a plurality of deflectors, each deflector arranged to deflect a corresponding group of the beamlets;
   a control unit for controlling movement of the substrate support member in the first direction and deflection of the groups of beamlets in the second direction to scan the beamlets on the surface of the target;
   wherein the movement of the substrate support member and deflection of the groups of beamlets is such that, in combination with the arrangement of the apertures in the one or more apertures arrays, the distance between adjacent parallel scan lines exposed by the beamlets of each group of beamlets is smaller than a pitch between beamlets from adjacent apertures of the aperture array which generated the group of beamlets.

13. The system of claim 12, wherein the control unit is configured to control movement of the substrate support member and deflection of the groups of beamlets so that at least a portion of a group of the beamlets exposes a portion of a first stripe of the field and a portion of the group of beamlets also exposes a portion of a second stripe of the field adjacent to the first stripe.

14. The system of claim 12, wherein the control unit is configured to control movement of the substrate support member and deflection of the groups of beamlets so that the scan lines of the beamlets each comprise a pattern section within a first stripe and an overscan section within an adjoining stripe.

15. The system of claim 12, wherein at least one of the aperture arrays for generating the charged particle beamlets comprises apertures arranged in rows, each aperture in a row being offset with respect to an adjacent aperture, the offset being in a direction perpendicular to the first direction.

16. The system of claim 15, wherein the offset between adjacent apertures in the row of the at least one aperture array, the relative movement in the first direction, and the deflection of the plurality of beamlets in the second direction result in the distance between adjacent parallel scan lines exposed by the beamlets being smaller than a pitch between adjacent apertures of the aperture array.

17. The system of claim 12, wherein the distance between subsequent scan lines exposed by the same beamlet within the array of beamlets is smaller than the projected size of the array in the first direction.

18. The system of claim 12, further comprising a beamlet blanker array for controllably blanking individual beamlets of the plurality of beamlets for exposing or not exposing the target by respective beamlets at defined positions.

19. The system of claim 12, wherein scan lines of one or more beamlets from a second scan are interleaved with scan lines of one or more beamlets from a first scan.

20. The system of claim 12, further comprising an array of projection lens systems for projecting the groups of beamlets on to the surface of the target, each projection lens system corresponding with a group of beamlets.

* * * * *